United States Patent
Kim et al.

(10) Patent No.: US 9,196,487 B2
(45) Date of Patent: Nov. 24, 2015

(54) METHOD FOR FORMING ELECTRODE OF N-TYPE NITRIDE SEMICONDUCTOR, NITRIDE SEMICONDUCTOR DEVICE, AND MANUFACTURING METHOD THEREOF

(71) Applicants: Tae Hun Kim, Anysang-si (KR); Sung Joon Kim, Suwon-si (KR); Young Kyu Sung, Osan-si (KR); Wan Ho Lee, Hwaseong-si (KR); Tae Sung Jang, Hwaseong-si (KR); Tae Young Park, Yongin-si (KR); Wan Tae Lim, Suwon-si (KR)

(72) Inventors: Tae Hun Kim, Anysang-si (KR); Sung Joon Kim, Suwon-si (KR); Young Kyu Sung, Osan-si (KR); Wan Ho Lee, Hwaseong-si (KR); Tae Sung Jang, Hwaseong-si (KR); Tae Young Park, Yongin-si (KR); Wan Tae Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/336,082

(22) Filed: Jul. 21, 2014

(65) Prior Publication Data
US 2015/0126022 A1    May 7, 2015

(30) Foreign Application Priority Data
Nov. 7, 2013 (KR) .................. 10-2013-0135026

(51) Int. Cl.
*H01L 21/00* (2006.01)
*H01L 21/223* (2006.01)
*H01L 21/285* (2006.01)

(52) U.S. Cl.
CPC ...... *H01L 21/2236* (2013.01); *H01L 21/28575* (2013.01)

(58) Field of Classification Search
None
See application file for complete search history.

(56) References Cited

U.S. PATENT DOCUMENTS

| | | | |
|---|---|---|---|
| 5,932,896 A * | 8/1999 | Sugiura et al. ................. | 257/94 |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 * | 2/2005 | Biwa et al. ..................... | 117/89 |
| 6,967,353 B2 * | 11/2005 | Suzuki et al. ................. | 257/95 |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |

(Continued)

OTHER PUBLICATIONS

Hyun Kyong Cho, An improved non-alloyed ohmic contact Cr/Ni/Au to n-type GaN with with surface treatment, Journal of Physics D: Applied Physics, May 2008, 4 pages, IOP Publishing.

(Continued)

*Primary Examiner* — Scott B Geyer
*Assistant Examiner* — Evren Seven
(74) *Attorney, Agent, or Firm* — Harness, Dickey & Pierce, P.L.C.

(57) ABSTRACT

According to an example embodiment, a method includes forming a nitrogen vacancy surface layer by treating a surface of an n-type nitride semiconductor with inert gas plasma, and forming an oxygen-added nitride film by treating a surface of the nitrogen vacancy surface layer with oxygen-containing gas plasma, and forming an electrode on the oxygen-added nitride film. The nitrogen vacancy surface layer lacks a nitrogen element.

20 Claims, 23 Drawing Sheets

(56) References Cited

U.S. PATENT DOCUMENTS

| | | | |
|---|---|---|---|
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,906,785 B2 | 3/2011 | Baik et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,049,226 B2 | 11/2011 | Lin et al. | |
| 8,129,711 B2 | 3/2012 | Kang et al. | |
| 8,179,938 B2 | 5/2012 | Kim | |
| 8,258,525 B2 | 9/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 2004/0029365 A1* | 2/2004 | Linthicum et al. | 438/481 |
| 2004/0051099 A1* | 3/2004 | Moustakas | 257/49 |
| 2006/0043384 A1 | 3/2006 | Cho et al. | |
| 2006/0289860 A1* | 12/2006 | Ichinose et al. | 257/43 |
| 2007/0158683 A1* | 7/2007 | Sheppard et al. | 257/183 |
| 2009/0230513 A1* | 9/2009 | Yoo et al. | 257/609 |
| 2009/0278233 A1* | 11/2009 | Pinnington et al. | 257/615 |
| 2010/0295100 A1* | 11/2010 | Huang et al. | 257/256 |
| 2010/0314653 A1* | 12/2010 | Orita et al. | 257/98 |
| 2012/0052679 A1* | 3/2012 | Hou et al. | 438/660 |
| 2012/0104556 A1* | 5/2012 | Kiyama et al. | 257/615 |
| 2012/0119332 A1* | 5/2012 | Atanackovic | 257/616 |
| 2013/0069072 A1* | 3/2013 | Tomabechi | 257/76 |
| 2013/0313561 A1* | 11/2013 | Suh | 257/76 |
| 2014/0008661 A1* | 1/2014 | Iwami et al. | 257/76 |
| 2015/0179872 A1* | 6/2015 | Zhang et al. | 257/76 |

OTHER PUBLICATIONS

Ho Won Jang, Characterization of band bendings on Ga-face and N-face GaN films grown by metalorganic chemical-vapor deposition, Applied Physics Letters, May 2002, 3955-3957 (3 Pages), vol. 80, No. 21, American Institute of Physics.

T. Jang, Investigation of Pd/Ti/Al and Ti/Al Ohmic contact materials on Ga-face and N-face surfaces of n-type GaN, Applied Physics Letters, May 2006, 3 pages, vol. 88, No. 19, American Institute of Physics.

Joon-Woo Jeon, Tin/Al Ohmic contacts to N-face n-type GaN for high-performance vertical light-emitting diodes, Applied Physics Letters, Jan. 2009, 3 pages, vol. 94, No. 4, American Institute of Physics.

Hyunsoo Kim, Electrical Characteristics of Metal Contacts to Laser-Irradiated N-Polar n-type GaN, Apr. 2009, 319-321 (3 pages), vol. 30, No. 4 IEEE Electron Device Letters.

Su Jin Kim, Low-Resistance Nonalloyed Ti/Al Ohmic Contacts on N-Face n-Type GaN via $O_2$ Plasma Treatment, 2010, 3 pages, IEEE Electron Device Letters.

* cited by examiner

METHOD FOR FORMING ELECTRODE OF N-TYPE NITRIDE SEMICONDUCTOR, NITRIDE SEMICONDUCTOR DEVICE, AND MANUFACTURING METHOD THEREOF

CROSS-REFERENCE TO RELATED APPLICATION

This application claims priority under 35 U.S.C. §119 to Korean Patent Application No. 10-2013-0135026, filed on Nov. 7, 2013, with the Korean Intellectual Property Office, the entire disclosure of which is incorporated herein by reference.

BACKGROUND

The present disclosure relates to a method for forming an electrode on a surface of an n-type nitride semiconductor, a nitride semiconductor device using the same, and a manufacturing method thereof.

Nitride semiconductor, such as gallium nitride (GaN), has been used in various electronic elements. In particular, nitride semiconductor has been widely used in a semiconductor light emitting diode (LED) field, and the use of nitride semiconductor light emitting elements are being extended in coverage from backlight units (BLUs) for various displays such as optical communication and mobile display, computer monitors, and the like, to various lighting systems.

It may be difficult for a nitride semiconductor to form an ohmic-contact with some generally used electrode materials due to a high work function. It may be more difficult for an n-type nitride semiconductor layer, such as an n-type GaN, to form ohmic-contact with an N face rather than with a Ga face (G-face). Thus, a scheme of performing a buffered oxide etch (BOE) treatment or a laser treatment on a surface of an n-type nitride semiconductor layer before depositing an n electrode, or using a metal such as TiN as an n electrode, has been proposed. However, a heat treatment process at high temperatures may be involved. Undergoing a heat treatment at high temperatures may form a leakage path or may weaken a bonded portion of eutectic metal due to agglomeration of metal such as aluminum (Al). A metal, such as chromium (Cr), may be used as a substitute to improve ohmic-characteristics, but the low reflectivity of some metals such as chromium (Cr) may be undesirable for applications in a field such as light emitting elements.

SUMMARY

An aspect of the present disclosure relates to a technique for treating a surface on which an electrode is to be formed to form ohmic-contact with an n-type nitride semiconductor.

According to an example embodiment, a method for forming an electrode on an n-type nitride semiconductor may include: forming a nitrogen vacancy surface layer by treating a surface of an n-type nitride semiconductor with inert gas plasma; forming an oxygen-added nitride film by treating a surface of the nitrogen vacancy surface layer with oxygen-containing gas plasma; and forming an electrode on the oxygen-added nitride film. The nitrogen vacancy surface layer lacks a nitrogen element.

In an example embodiment, the forming the nitrogen vacancy surface layer may include using an inert gas to form the inert gas plasma, and the oxygen-added nitride film may contain the inert gas as an impurity.

In an example embodiment, the n-type nitride semiconductor may be an n-type gallium nitride (GaN). In this case, the oxygen-added nitride film may be a gallium oxy-nitride. Here, the forming the nitrogen vacancy surface layer may include using an inert gas to form the inert gas plasma. When the inert gas is argon (Ar), the oxygen-added nitride film may be a gallium oxy-nitride including argon (Ar) added as an impurity.

In an example embodiment, the forming the oxygen-added nitride film may include transforming the nitrogen vacancy surface layer into a residual nitrogen vacancy surface layer on the oxygen-added nitride film, and the method may further include removing the residual nitrogen vacancy surface layer before the forming the electrode.

In an example embodiment, the n-type nitride semiconductor may be an n-type gallium nitride (GaN), and the residual nitrogen vacancy surface layer may include gallium oxide.

In an example embodiment, the inert gas may include at least one of helium (He), neon (Ne), argon (Ar), krypton (Kr), and xenon (Xe). The forming the oxy-gen added nitride film may include using oxygen ($O_2$) to form oxygen-containing gas plasma. The electrode may include at least one of silver (Ag) and aluminum (Al).

According to another example embodiment, a method may include: treating a surface of an n-type nitride semiconductor with an inert gas plasma; preparing a contact region by treating the surface treated with the inert gas plasma with oxygen-containing gas plasma; and forming an electrode on the contact region.

According to another example embodiment, a nitride semiconductor element may include: a nitride laminate including an n-type nitride semiconductor layer; an oxygen-added nitride film on a surface of the n-type nitride semiconductor layer; and an electrode on the oxygen-added nitride film. The oxygen-added nitride film includes an inert gas as an impurity.

In an example embodiment, the nitride semiconductor element may be a light emitting element. In this case, the nitride laminate may further include a p-type nitride semiconductor layer, and an active layer positioned between the p-type nitride semiconductor layer and the n-type nitride semiconductor layer.

In an example embodiment, the n-type nitride semiconductor layer may include an n-type gallium nitride (GaN) layer, and the electrode may be on a surface of the n-type gallium nitride (GaN) layer.

In an example embodiment, a thickness of the oxygen-added nitride film may be configured to allow tunneling.

According to another example embodiment, a method for manufacturing a nitride semiconductor element may include: preparing a nitride laminate having an n-type nitride semi-conductor layer; forming a nitrogen vacancy surface layer by treating a surface of the n-type nitride semiconductor layer with inert gas plasma; forming an oxygen-added nitride film by treating a surface of the nitrogen vacancy surface layer with oxygen-containing gas plasma; and forming an electrode on the oxygen-added nitride film. The nitrogen vacancy surface layer may lack a nitrogen element.

According to an example embodiment, a method of forming an electrode includes: forming a nitrogen vacancy surface layer by generating nitrogen vacancies in a first portion of a n-type nitride semiconductor layer, the first portion of the n-type nitride semiconductor layer being on a second portion of the n-type nitride semiconductor layer; treating a surface of the nitrogen vacancy surface layer with an oxygen-containing gas plasma; forming an oxygen-added nitride film in a third portion of the n-type nitride semiconductor layer by injecting oxygen atoms through the nitrogen vacancy surface layer into the third portion of the n-type nitride semiconductor layer, the third portion being between the first and second portions of the n-type nitride semiconductor layer; and forming an electrode on the oxygen-added nitride film.

In an example embodiment, the forming the nitrogen vacancy surface layer may include generating the nitrogen vacancies using an inert gas plasma.

In an example embodiment, the forming the oxygen-added nitride film may include injecting the oxygen atoms through the nitrogen vacancy surface layer using an oxygen-containing gas plasma.

In an example embodiment, the n-type nitride semiconductor may include a Group-III nitride semiconductor represented by the formula $Al_xIn_yGa_{1-x-y}N$, where $0 \leq x < 1$, $0 \leq y < 1$, and $0 \leq x+y < 1$.

In an example embodiment, the oxygen-added nitride film may include gallium oxy-nitride.

BRIEF DESCRIPTION OF DRAWINGS

The above and other aspects, features and other advantages of several example embodiments will be more clearly understood from the following detailed description of non-limiting embodiments, as illustrated in the accompanying drawings, in which like reference characters refer to like parts throughout the different views. The drawings are not necessarily to scale, emphasis instead being placed upon illustrating principles of inventive concepts. In the drawings.

DETAILED DESCRIPTION

Figure 1:
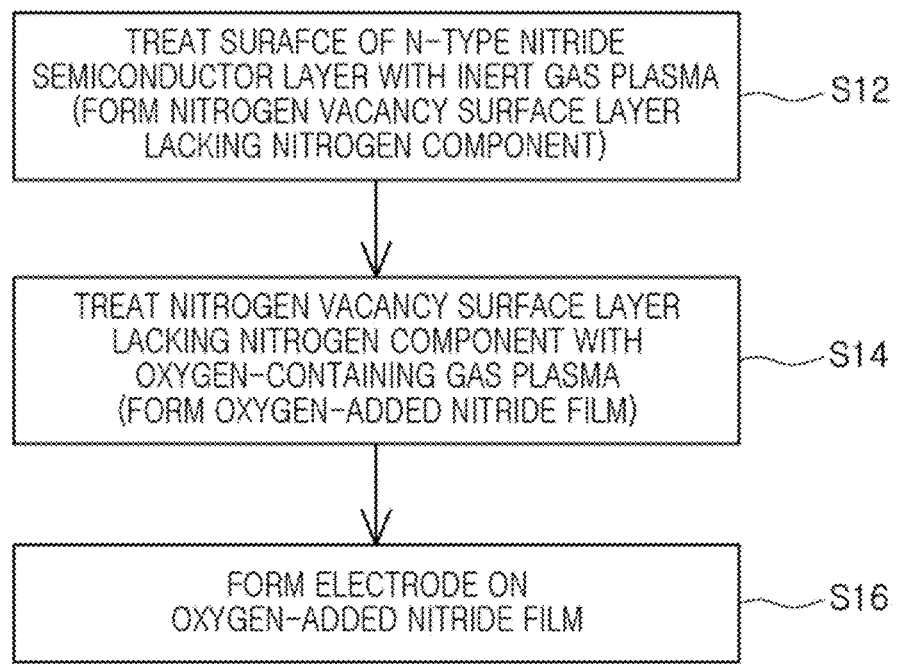
FIG. 1 is a flow chart illustrating a method of forming an electrode on an n-type nitride semiconductor according to an example embodiment.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of forming an electrode on an n-type nitride semiconductor according to an example embodiment.

Referring to FIG. 1, in operation (S12) a surface of an n-type nitride semiconductor may be treated with inert gas plasma.

The n-type nitride semiconductor may be a Group-III nitride semiconductor such as n-type $Al_xIn_yGa_{1-x-y}N$ ($0 \leq x$, $y<1$, $0 \leq x+y<1$). The n-type nitride semiconductor may be n-type $Al_xIn_yGa_{1-x-y}N$ ($0 \leq x<1$, $0 \leq y<1$, $0 \leq x+y<1$). For example, the n-type nitride semiconductor may be n-type gallium nitride (GaN). The n-type nitride semiconductor may include at least one n-type dopant. The n-type dopant may be at least one of carbon (C), silicon (Si), germanium (Ge), tin (Sn), and lead (Pb). However, example embodiments are not limited thereto.

The inert gas may include at least one selected from the group consisting of helium (He), neon (Ne), argon (Ar), krypton (Kr), and xenon (Xe). The surface of the n-type nitride semiconductor may be treated with plasma generated by using the inert gas.

During the plasma treatment, a plurality of nitrogen vacancies may be generated from the surface of the n-type nitride semiconductor to a desired (and/or alternatively predetermined) depth, forming a nitrogen vacancy surface layer relatively lacking a nitrogen element near the surface of the n-type nitride semiconductor.

In a subsequent operation (S14), the surface, which has been treated with the inert gas plasma, may be treated with oxygen-containing gas plasma to form an oxygen-containing nitride film.

During this process, an oxygen-added nitride film may be obtained near the surface which has been treated with the inert gas plasma. Namely, oxygen infiltrates into the nitrogen vacancy surface layer so as to be combined with the nitride semiconductor to form the oxygen-added nitride film. The oxygen-added nitride film may include an oxy-nitride film. For example, in a case in which the n-type nitride semiconductor is an n-type GaN, the oxygen-added nitride film may be a gallium oxy-nitride. The gallium oxy-nitride formed during this process may be expressed as $GaO_xN_{1-x}$ ($0<x<0.5$). For example, $O_2$ may be used as the oxygen-containing gas, but example embodiments are not limited thereto. For example, a different oxygen-containing gas such as $NO_2$ may also be used, and/or be used instead of $O_2$.

In a subsequent operation, at least one electrode may be formed on the oxygen-added nitride film.

The electrode may include at least one metal selected from the group consisting of aluminum (Al), silver (Ag), nickel (Ni), rhodium (Rh), palladium (Pd), iridium (Ir), ruthenium (Ru), magnesium (Mg), zinc (Zn), platinum (Pt), gold (Au), chromium (Cr), and titanium (Ti). Aluminum (Al) and/or gold (Ag) may be used to form the at least one electrode, but example embodiments are not limited thereto. The oxygen-added nitride film may be configured to allow for tunneling, implementing ohmic-contact between the n-type nitride semiconductor and the electrode. An acid treatment for cleaning may be employed before the electrode formation process. Details thereof will be described hereinbelow.

In this manner, by performing two types of plasma treatment, an oxygen-added nitride film such as gallium oxy-nitride ($GaO_xN_{1-x}$) used for ohmic-contact formation may be effectively formed. The inert gas plasma treatment and the oxygen-containing gas plasma treatment may be performed continuously. The two types of plasma treatment may be employed for different purposes.

First, during a first plasma treatment process using inert gas plasma, a plurality of nitrogen vacancies may be formed to form a path allowing oxygen to be easily injected therethrough. During a follow-up second plasma treatment process using an oxygen-containing gas plasma, oxygen may be smoothly injected through the path formed during the first plasma treatment, and as a result, an oxygen-added nitride film may be effectively formed.

In this manner, using the inert gas plasma is more effective in breaking Ga—N bond, than using the oxygen-containing gas plasma. Thus, in comparison to a case in which the oxygen-containing gas plasma is directly treated without inert gas plasma treatment, in the case of using the plasma treatment process twice as described above with reference to FIG. 1, the oxygen-added nitride film may be formed more effectively.

The surface modification process based on the aforementioned plasma treatment will be described in more detail with reference to FIGS. 2A through 2E. FIGS. 2A through 2E are cross-sectional views illustrating a method for forming an electrode of an n-type nitride semiconductor according to an example embodiment.

Figure 2A:
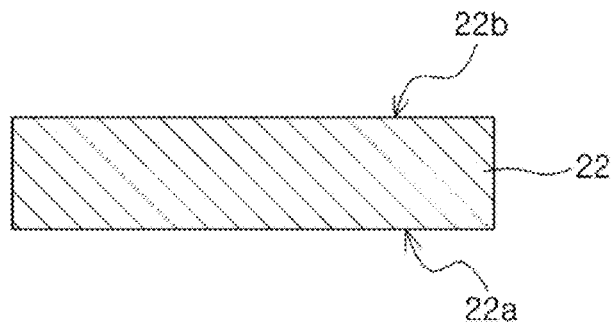
FIGS. 2A through 2E are cross-sectional views illustrating a method for forming an electrode of an n-type nitride semiconductor according to an example embodiment.

Referring to FIG. 2A, an n-type nitride semiconductor 22 may be prepared.

The n-type nitride semiconductor 22 may be a Group-III nitride semiconductor satisfying n-type $Al_xIn_yGa_{1-x-y}N$ ($0 \leq x$, $y<1$, $0 \leq x+y<1$). The n-type nitride semiconductor 22 may be n-type $Al_xIn_yGa_{1-x-y}N$ ($0 \leq x<1$, $0 \leq y<1$, $0 \leq x+y<1$). For example, the n-type nitride semiconductor 22 may be an n-type gallium nitride (GaN). The n-type dopant of the n-type nitride semiconductor may be silicon (Si), but example embodiments are not limited thereto and at least one of carbon (C), germanium (Ge), tin (Sn), and lead (Pb) may be used alone or together with silicon (Si). In other words, the n-type nitride semiconductor 22 may include at least one of silicon (Si), carbon (C), germanium (Ge), tin (Sn), and lead (Pb) as an n-type dopant.

The n-type nitride semiconductor 22 may provide a contact region in which an electrode may be formed. The n-type nitride semiconductor 22 may be understood as a part of various types of nitride semiconductor elements such as a field effect transistor (FET) as well as a semiconductor light emitting diode (LED).

In a case in which the n-type nitride semiconductor 22 is GaN, the first surface 22a may be an N surface, and the opposite second surface 22b may be a Ga face. In general, the Ga face may be a surface positioned in a growth direction. Although FIGS. 2A to 2E illustrate an example in which ohmic-contact is formed in the Ga face as the second surface 22b, the electrode forming method in FIGS. 2A to 2E may also be applied to the N surface 22a in a similar manner.

Figure 2B:
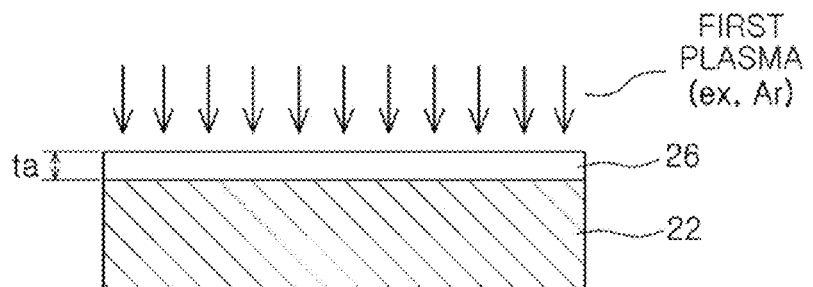

Referring to FIG. 2B, the surface 22b of the n-type nitride semiconductor 22 may be treated with inert gas plasma. During this process, a nitrogen vacancy surface layer 26 may be formed.

The term "nitrogen vacancy surface layer" may be a layer formed near the treated surface and may be a region lacking a nitrogen element due to an excessive occurrence of nitrogen vacancies. The nitrogen vacancy surface layer may be understood as a surface layer obtained as nitrogen vacancies are formed as a bonding between a nitrogen element and a different element is broken by the inert gas plasma treatment.

A thickness ta of the nitrogen vacancy surface layer 26 may be adjusted according to plasma generation and treatment conditions. For example, the nitrogen vacancy surface layer 26 may be formed to have a desired thickness by adjusting at least one process factor related to plasma generation and/or treatment conditions such as source power, a flow rate of plasma, a flow rate of a process gas, a temperature, a degree of vacuum, an exposure time, and the like. The nitrogen vacancy surface layer 26 may be formed to have a thickness greater than a desired thickness of an oxygen-added nitride film (e.g., a gallium oxy-nitride film) prepared in a follow-up process. The thickness ta of the nitrogen vacancy surface layer 26 may range from approximately 10 nm to 200 nm, but example embodiments are not limited thereto.

When the n-type nitride semiconductor is an n-type GaN, the Ga—N bond may be broken, starting from the surface of the n-type GaN due to the inert gas plasma. As a result, a plurality of nitrogen vacancies may be generated to form the nitrogen vacancy surface layer 26.

At least one of helium (He), neon (Ne), argon (A), krypton (Kr), and xenon (Xe) may be used as an inert gas for the plasma treatment. For example, in the case of n-type GaN, argon (Ar) may be used as an inert gas for a first plasma treatment.

Figure 2C:
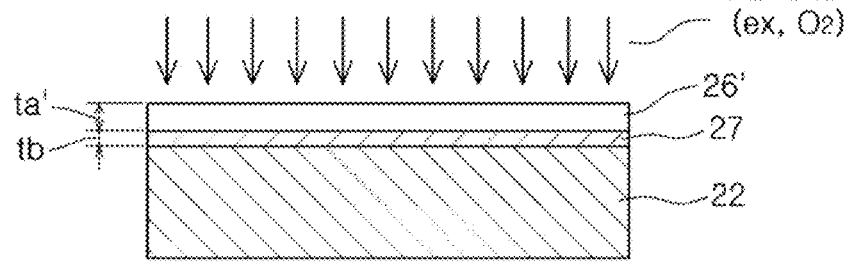

Subsequently, as illustrated in FIG. 2C, the surface with the nitrogen vacancy surface layer (26 in FIG. 2(b)) may be treated with an oxygen-containing gas plasma.

Through the oxygen-containing gas plasma treatment, oxygen may be injected into the n-type nitride semiconductor 22 through the nitrogen vacancy surface layer 26. Since the inert gas plasma treatment has been performed prior to the oxygen-containing gas plasma treatment, an oxygen element may be smoothly injected into the nitride semiconductor 22 through the nitrogen vacancies during the oxygen-containing gas plasma treatment. As a result, the oxygen-containing nitride film 27 may be formed in the interface between a residual nitrogen vacancy surface layer 26' and the nitride semiconductor 22. Also, the residual nitrogen vacancy surface layer 26' may be combined with oxygen in a process of injecting oxygen through the nitrogen vacancies so as to be converted into an oxide.

In the case in which the n-type nitride semiconductor is an n-type GaN, the oxygen-added nitride film 27 may be a gallium oxy-nitride, and such a gallium oxy-nitride may be expressed as $GaO_xN_{1-x}$ ($0<x<0.5$). Also, the residual nitrogen vacancy surface layer 26' may be an oxide such as a gallium oxide, and such a gallium oxide may be expressed as $Ga_yO_{1-y}$ ($0<y<0.5$).

The oxygen-added nitride film 27 may have a thickness tb allowing for tunneling. The thickness tb of the oxygen-added nitride film 27 may range from approximately 5 nm to 20 nm, but example embodiments are not limited thereto.

The thickness tb of the oxygen-added nitride film 27 may be adjusted according to plasma generation and treatment conditions. For example, the oxygen-added nitride film 27 may be formed to have a desired thickness by adjusting at least one process factor related to plasma generation and treatment conditions such as source power, flow rate of plasma, temperature, a flow rate of a process gas, degree of vacuum, exposure time, and the like. A thickness ta' of the residual nitrogen vacancy surface layer 26' may be slightly smaller than or substantially equal to the thickness ta of the initial nitrogen vacancy surface layer 26.

In particular, the oxygen-added nitride film 27 obtained during this process may contain an element of an inert gas used in the first plasma treatment process as an impurity. This is because the inert gas element infiltrated through the nitride semiconductor during the first plasma treatment process may remain therein. Such an inert gas element does not significantly affect characteristics of the oxygen-added nitride film. In this sense, the inert gas element may be understood as simply being contained as an impurity.

$O_2$ may be used as the oxygen-containing gas to generate plasma during this process, but a different oxygen-containing gas such as $NO_2$ may be used alternatively.

Figure 2D:
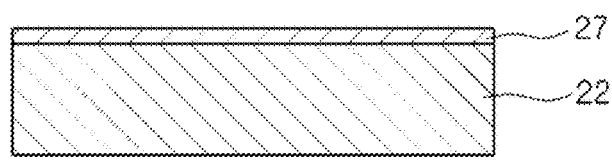

Thereafter, as illustrated in FIG. 2d, the residual nitrogen vacancy surface layer 26' may be removed from the oxygen-added nitride film 27.

This selective removal process may be implemented through an acid treatment process. Namely, an acid etching solution having a high selective etching rate may be used for the nitrogen vacancy surface layer 26' remaining after the second plasma treatment and the oxygen-added nitride film 27 positioned therebelow. For example, the residual nitrogen vacancy surface layer 26' such as an oxide may be effectively removed by using HCl. A time of the acid treatment process may be adjusted to remove the nitrogen vacancy surface layer 26' without removing the oxygen-added nitride film 27.

This selective etching process may be omitted as needed. Namely, after the oxygen-containing gas plasma treatment, an electrode process may be immediately performed without a selective etching process. For example, in a case in which the nitrogen vacancy surface layer 26' remaining after the second plasma treatment has electrical characteristics that do not exert significant influence, or in a case in which a byproduct such as an oxide film is generated but it is excessively thin or does not exert significant influence, the selective etching process may be omitted.

Figure 2E:
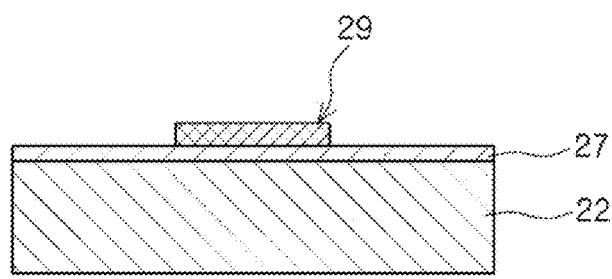

Subsequently, as illustrated in FIG. 2E, an electrode 29 is formed on the oxygen-added nitride film 27.

The electrode 29 may be in ohmic-contact with the n-type nitride semiconductor 22 through a tunneling behavior of the oxygen-added nitride film 27. A metal having high reflectivity such as aluminum (Al) and silver (Ag) may be employed as a material of the electrode 29 to implement ohmic-contact with the n-type nitride semiconductor 22. In order to improve contact characteristics, an additional heat treatment process may be omitted.

A material of the electrode is not limited to aluminum (Al) and silver (Ag). For example, the electrode 29 may include at least one selected of nickel (Ni), rhodium (Rh), palladium (Pd), iridium (Ir), ruthenium (Ru), magnesium (Mg), zinc (Zn), platinum (Pt), gold (Au), chromium (Cr), and titanium (Ti).

As aforementioned, the oxygen-added nitride film 27 may contain an element of the inert gas used in the first plasma treatment process as an impurity, and the inert gas element contained as an impurity may be understood as demonstrating that the oxygen-added nitride film 27 has been performed through not only the oxygen-containing gas plasma treatment but the inert gas plasma treatment.

According to an example embodiment, the electrode forming method described above with reference to FIGS. 2A to 2E may be utilized as a method for forming an n-side electrode of various nitride semiconductor elements. For example, according to an example embodiment, the electrode forming method described above with reference to FIGS. 2A to 2E may be used to form an n-side electrode of a product where additional features (e.g., high reflectivity) other than the electrical characteristics such as ohmic-contact are desired.

A method for manufacturing a nitride semiconductor light emitting element according to an example embodiment will be described with reference to FIGS. 3A through 3G.

Figure 3A:
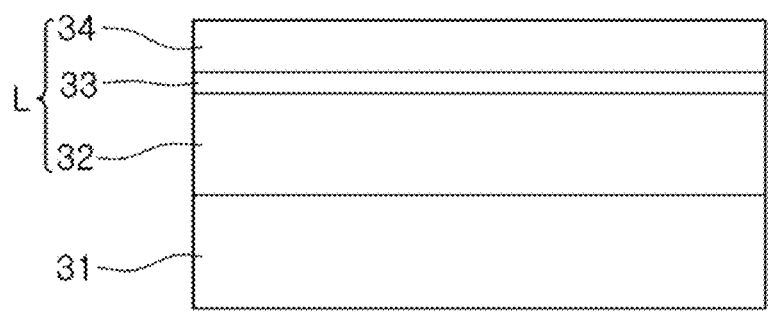
FIGS. 3A through 3G are cross-sectional views illustrating a method for manufacturing a nitride semiconductor light emitting element according to an example embodiment.

Referring to FIG. 3A, a nitride laminate L having an n-type nitride semiconductor layer 32 is prepared on a substrate 31.

The substrate 31 may be a substrate for growing a nitride semiconductor thereon. For example, the substrate 31 may be a sapphire, SiC, Si, $MgAl_2O_4$, MgO, $LiAlO_2$, $LiGaO_2$, or GaN substrate, but example embodiments are not limited thereto. In addition to the n-type nitride semiconductor layer 32, the nitride laminate L may further include a p-type nitride semiconductor layer 34 and an active layer 33 positioned between the p-type nitride semiconductor layer 34 and the n-type nitride semiconductor layer 32 as a semiconductor light emitting element.

The nitride laminate L may be formed of $Al_xIn_yGa_{1-x-y}N$ (0≤x, y≤1, 0≤x+y≤1). The nitride laminate L may include n-type $Al_xIn_yGa_{1-x-y}N$ (0≤x<1, 0≤y<1, 0≤x+y<1). The n-type nitride semiconductor layer 32 may include a plurality of nitride layers having different compositions, and a region providing an n-contact region may be a nitride semiconductor satisfying n-type $Al_xIn_yGa_{1-x-y}N$ (0≤x, y<1, 0≤x+y<1). The n-contact region may be n-type $Al_xIn_yGa_{1-x-y}N$ (0≤x<1, 0≤y<1, 0≤x+y<1). For example, the n-contact region may include n-type gallium nitride (GaN). The n-type nitride semiconductor 32 may include at least one of carbon (C), silicon (Si), germanium (Ge), tin (Sn), and lead (Pb) as an n-type dopant.

Figure 3B:
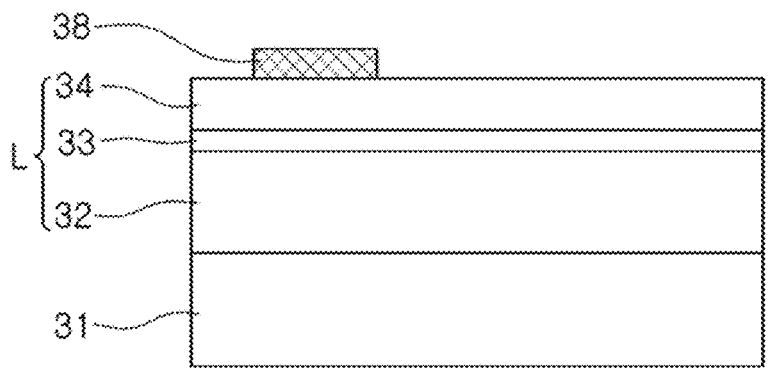
Figure 3C:
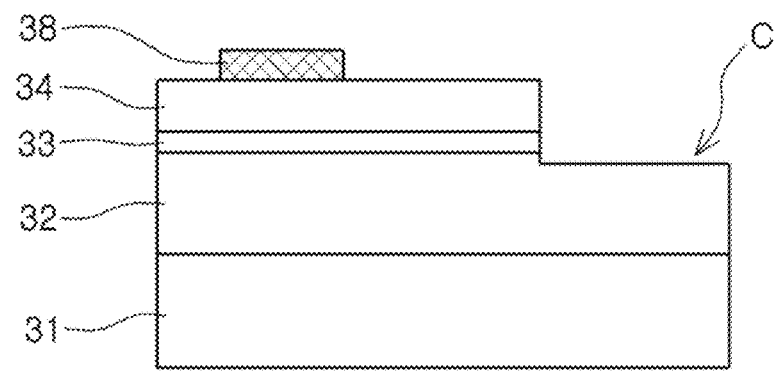

Subsequently, as illustrated in FIG. 3B, a p-side electrode 38 may be formed on the p-type nitride semiconductor layer 34. Referring to FIG. 3C, mesa etching may be performed to remove partial regions of the p-type nitride semiconductor layer 34 and the active layer 33 to expose a region in which an n-side electrode (39 in FIG. 3G) may be formed. The p-type nitride semiconductor layer 34 may include magnesium (Mg) as a p-type dopant, but example embodiments are not limited thereto.

An order related to this process may be variously modified. For example, the process of forming the p-side electrode 38 may be performed after the mesa etching process (FIG. 3C), before or after the n-side electrode formation process (FIG. 3G), or simultaneously as the n-side electrode formation process.

A contact region C of the n-type nitride semiconductor layer 32 obtained after mesa etching may be a surface facing a growth direction. For example, the contact region C may be a Ga face. In a case in which it is desirable to prevent and/or limit damage to a different region during a follow-up plasma treatment process, a mask M may be formed on the nitride laminate L such that the contact region C may be exposed as illustrated in FIG. 3D.

Figure 3D:
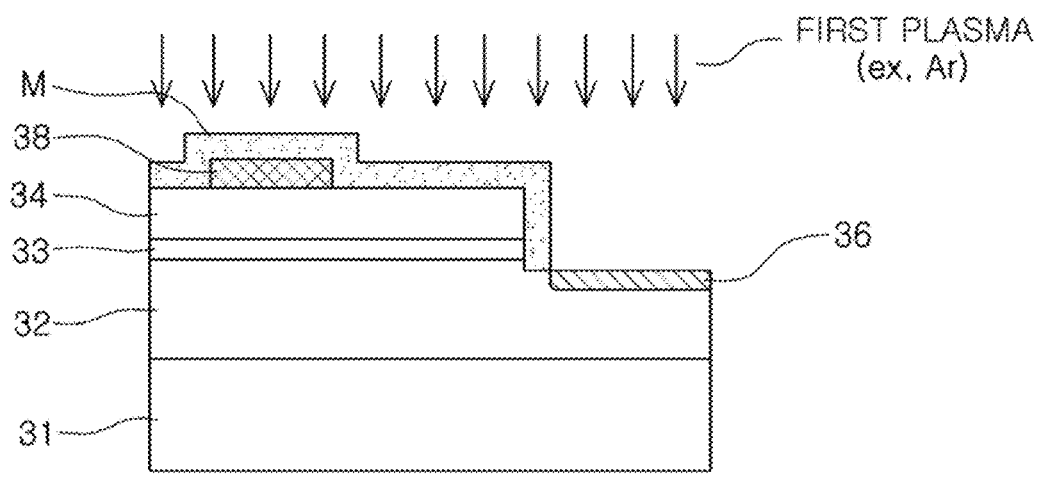

Thereafter, as illustrated in FIG. 3D, the surface of the n-type nitride semiconductor layer 32 exposed by the mask M may be treated with inert gas plasma to form the nitrogen vacancy surface layer 36.

During the first plasma treatment process, a plurality of nitrogen vacancies may be generated in a region from the surface of the n-type nitride semiconductor layer 32 to a desired (and/or alternatively predetermined) depth, forming a nitrogen vacancy surface layer 36 relatively lacking the nitrogen element near the surface of the n-type nitride semiconductor layer 32. In other words, the nitrogen vacancy surface layer 36 may have a greater concentration of nitrogen vacancies compared to a portion of the n-type nitride semiconductor layer 32 that is not treated with the inert gas plasma.

In this case, the generation of the nitrogen vacancies may be understood as breaking of a bond between nitrogen and a different element by to the inert gas plasma treatment. Namely, in a case in which the n-type nitride semiconductor layer 32 is an n-type GaN, Ga—N bond is broken, starting from the surface of the n-type GaN due to the inert gas plasma, generating formation of a plurality of nitrogen vacancies to result in formation of the nitrogen vacancy surface layer 36.

Figure 3E:
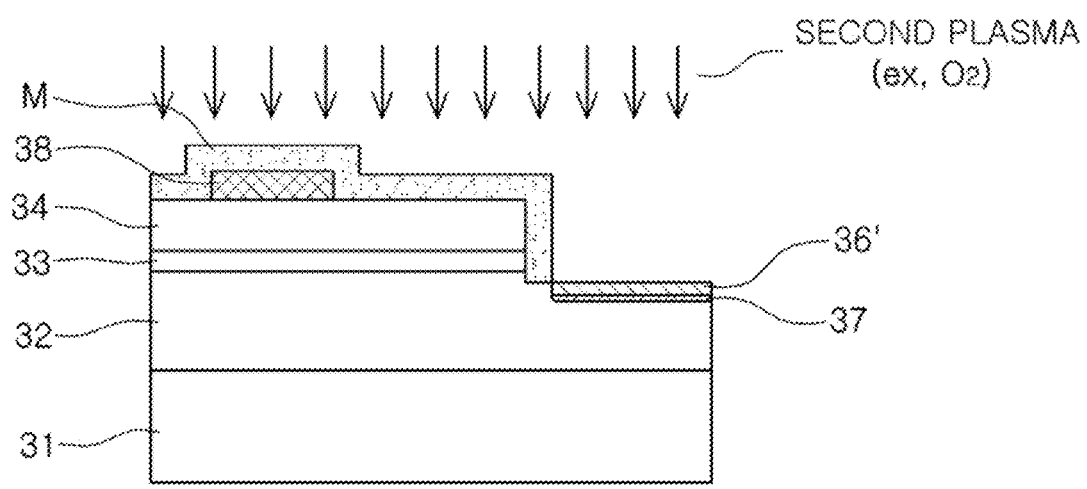

At least one of helium (He), neon (Ne), argon (Ar), krypton (Kr), and xenon (Xe) may be used as an inert gas for the plasma treatment. For example, in case of an n-type GaN, argon (Ar) may be used as an inert gas for the first plasma treatment Subsequently, as illustrated in FIG. 3E, the surface of the nitrogen vacancy surface layer (36 in FIG. 3D) may be treated with an oxygen-containing gas plasma to form an oxygen-added nitride film 37.

Through the oxygen-containing gas plasma treatment during this process, oxygen may be injected into the n-type nitride semiconductor layer 32 through the nitrogen vacancy surface layer 36. Since the inert gas plasma treatment is first performed, nitrogen vacancies may be formed, and an oxygen injection path may be formed. Through the oxygen-containing gas plasma treatment, oxygen may be effectively injected into even the n-type nitride semiconductor 32 positioned in the interface.

As a result, oxygen may be combined with the nitride to form the oxygen-added nitride film 37, and the oxygen-added nitride film 37 may serve as a tunneling layer guaranteeing ohmic-contact in the event of formation of the n-side electrode. Also, a nitrogen vacancy surface layer 36' remaining after the second plasma treatment process may be partially combined with oxygen to form a byproduct such as an oxide.

In a case in which the n-type nitride semiconductor 32 providing the contact region C is n-type GaN, the oxygen-added nitride film 37 may be an gallium oxy-nitride, and the gallium oxy-nitride may be expressed as $GaO_xN_{1-x}$ ($0<x<0.5$). Also, the remaining nitrogen vacancy surface layer 36' may be an oxide such as gallium oxide, and the gallium oxide may be expressed as $Ga_yO_{1-y}$ ($0<y<0.5$).

In the oxygen-added nitride film, an element of the inert gas used to generate the first plasma may exist as an impurity. For example, in a case in which an argon (Ar) plasma is used, gallium oxy-nitride formed in this plasma (second plasma) treatment process may have argon (Ar) distributed as an impurity.

Figure 3F:
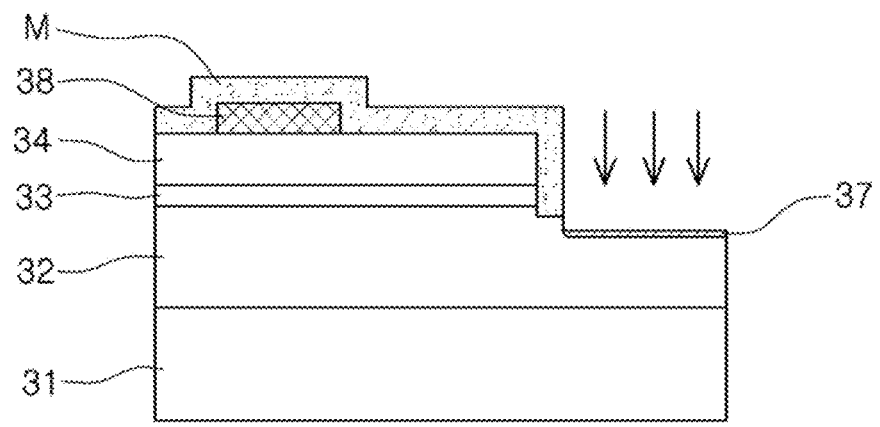

Thereafter, as illustrated in FIG. 3F, the residual nitrogen vacancy surface layer 36' may be removed from the oxygen-added nitride film 37.

This selective removal process may be implemented through an acid treatment process. For example, the residual nitrogen vacancy surface layer 36' may be effectively removed by using HCl to expose the oxygen-added nitride film 37 as the outermost surface. As discussed above, after the oxygen-containing gas plasma treatment, an electrode process may be performed according to whether the residual nitrogen vacancy surface layer 36' is to be formed and a state thereof, without the selective removal process.

Figure 3G:
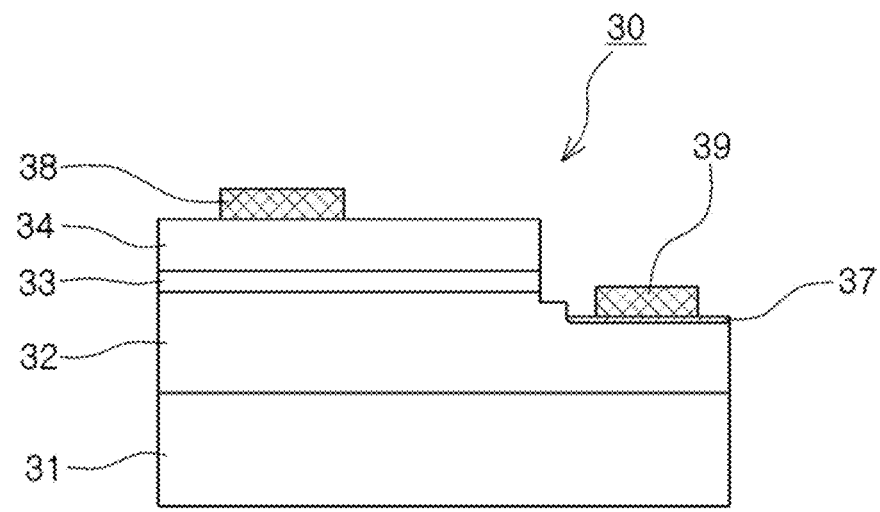

Subsequently, as illustrated in FIG. 3G, an electrode 39 may be formed on the oxygen-added nitride film 37.

The electrode 39 may be in ohmic-contact with the n-type nitride semiconductor 32 due to a tunneling behavior of the oxygen-added nitride film 37. A metal having high reflectivity such as aluminum (Al) and silver (Ag) may be used as a material of the electrode 39 to implement ohmic-contact with the n-type nitride semiconductor layer 32. In order to improve contact characteristics, an additional heat treatment process may be omitted.

The electrode 39 may be formed of materials other than aluminum (Al) and/or silver (Ag). For example, the electrode 39 may be formed of at least one of aluminum (Al), silver (Ag), nickel (Ni), rhodium (Rh), palladium (Pd), iridium (Ir), ruthenium (Ru), magnesium (Mg), zinc (Zn), platinum (Pt), gold (Au), chromium (Cr), and titanium (Ti).

A method for manufacturing a nitride semiconductor element implementing the ohmic-contact on the n-type nitride semiconductor layer may be applied to nitride semiconductor elements having various structures. Also, according to an example embodiment, the manufacturing method may also be applied to any surface without being limited to a specific surface. For example, in the method according to an example embodiment described above with reference FIGS. 3A through 3G, the electrode is formed on the Ga face of the nitride semiconductor (e.g., GaN). However, according to an example embodiment, an electrode may be formed on an N surface of the nitride semiconductor (e.g., GaN).

FIGS. 4A through 4G are cross-sectional views illustrating major processes of a method for manufacturing a nitride semiconductor light emitting element according to an example embodiment.

Figure 4A:
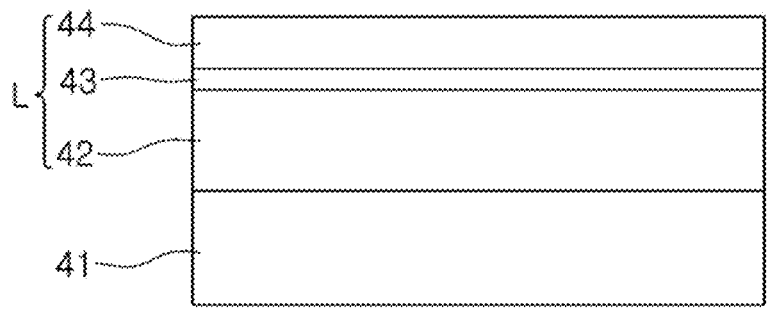
FIGS. 4A through 4G are cross-sectional views illustrating a method for manufacturing a nitride semiconductor light emitting element according to an example embodiment.

Referring to FIG. 4(a), an n-type nitride semiconductor layer 42, an active layer 43, and a p-type nitride semiconductor layer 44 may be sequentially formed on a substrate 41 to prepare a nitride laminate L. For example, an n-type nitride semiconductor layer 42, an active layer 43, and a p-type nitride semiconductor layer 44 may be sequentially grown on a growth substrate 41 to prepare a nitride laminate L.

The nitride laminate L may be formed using a metal-organic chemical vapor deposition (MOCVD) or molecular beam expitaxy (MBE) deposition process. The nitride laminate L may be formed of Group-III nitride semiconductor ($Al_xGa_yIn_{(1-x-y)}N$ ($0 \leq x \leq 1$, $0 \leq y \leq 1$, $0 \leq x+y \leq 1$)). The nitride laminate L may be $Al_xIn_yGa_{1-x-y}N$ ($0 \leq x<1$, $0 \leq y<1$, $0 \leq x+y<1$). The substrate 41 may include an inorganic material such as sapphire, SiC, Si, $MgAl_2O_4$, MgO, $LiAlO_2$, or $LiGaO_2$, but example embodiments are not limited thereto.

Subsequently, a permanent substrate 51 may be bonded to the nitride laminate L. The bond may be implemented by using a bonding metal. The permanent substrate 51 may be a conductive substrate, for example, a silicon (Si) substrate or an Si—Al alloy substrate.

Figure 4B:
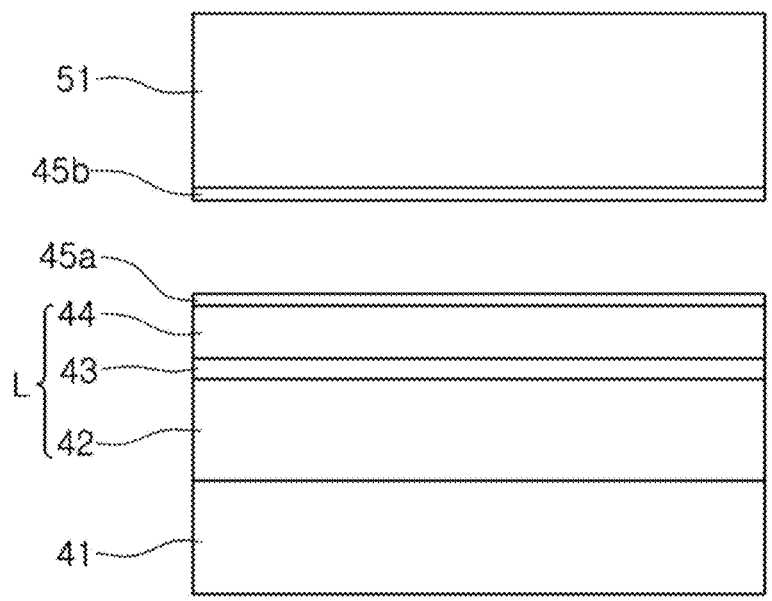

As illustrated in FIG. 4B, a first bonding metal layer 45a may be formed on the nitride laminate (in particular, on the p-type nitride semiconductor layer 44), and a second bonding metal layer 45b may be formed on a bonding surface of the permanent substrate 51. The first and second bonding metal layers 45a and 45b may include at least one metal. For example, the first and second bonding metal layers 45a and 45b may include at least one of nickel (Ni), platinum (Pt), gold (Au), copper (Cu), tin (Sn), indium (In), zinc (Zn), bismuth (Bi), cobalt (Co), and a combination thereof, or an alloy thereof.

The permanent substrate 51 may be on the second conductivity-type semiconductor layer 44 (or the p-type nitride semiconductor layer) such that the first and second bonding metal layers 45a and 45b face each other, and heat is applied thereto to melt the first and second bonding metal layers 45a and 45b to form a desired eutectic metal bonding layer EM. Accordingly, bonding of the permanent substrate 51 and the nitride laminate L may be implemented.

Figure 4C:
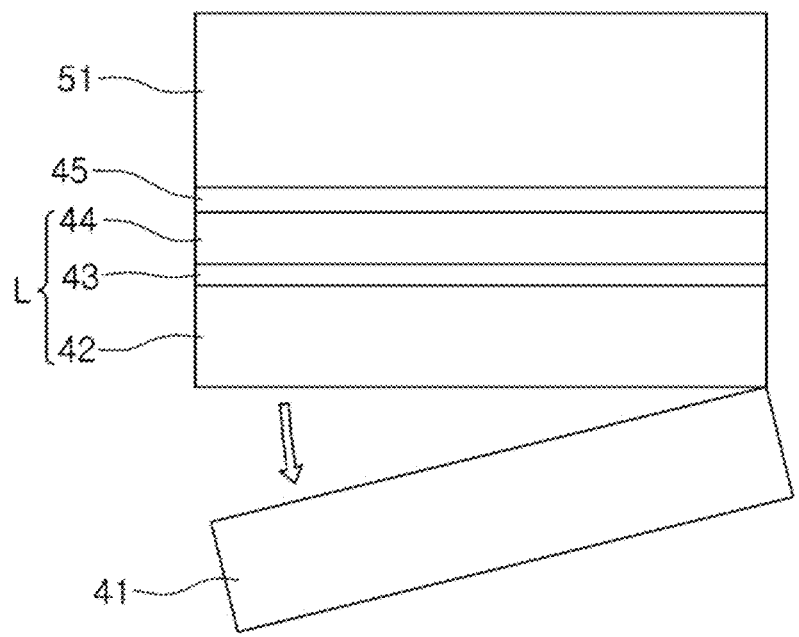

Thereafter, as illustrated in FIG. 4C, the growth substrate 41 may be separated from the nitride laminate L. A laser beam may be irradiated onto an interface between the growth substrate 41 and the n-type nitride semiconductor layer 42 to separate the growth substrate 41 from the nitride laminate L.

Figure 4D:
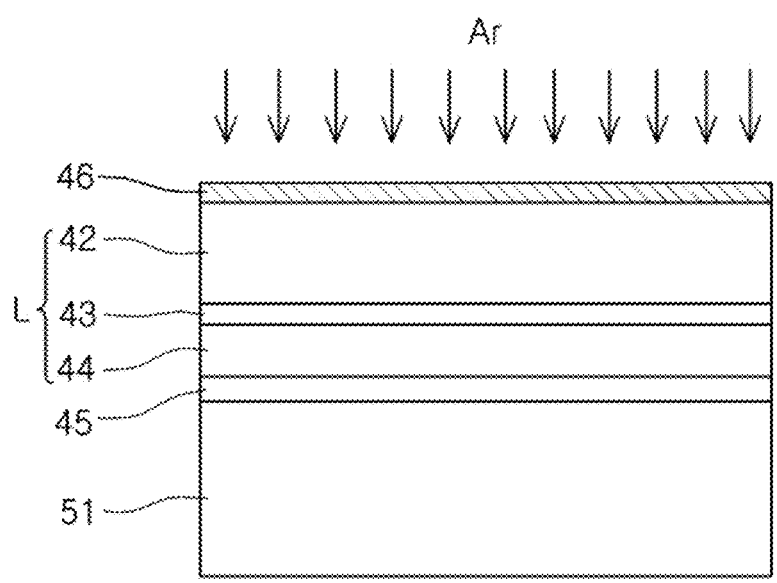

Subsequently, as illustrated in FIG. 4D, a surface of the n-type nitride semiconductor layer 42 may be treated with inert gas plasma such as argon (Ar) to form a nitride vacancy surface layer 46.

The surface of the n-type nitride semiconductor layer 42 treated with the Ar plasma is a surface exposed as the growth substrate was removed. Unlike the method described with reference to FIGS. 3A to 3G, the surface treated with the inert gas plasma in FIG. 4D is a surface opposite to the growth substrate, so may be an N surface.

During the inert gas plasma treatment process, a plurality of nitrogen vacancies may be generated from the surface of the n-type nitride semiconductor layer 42 to a desired (and/or alternatively predetermined) depth, forming a nitrogen vacancy surface layer 46 relatively lacking a nitrogen element near the surface of the n-type nitride semiconductor.

Figure 4E:
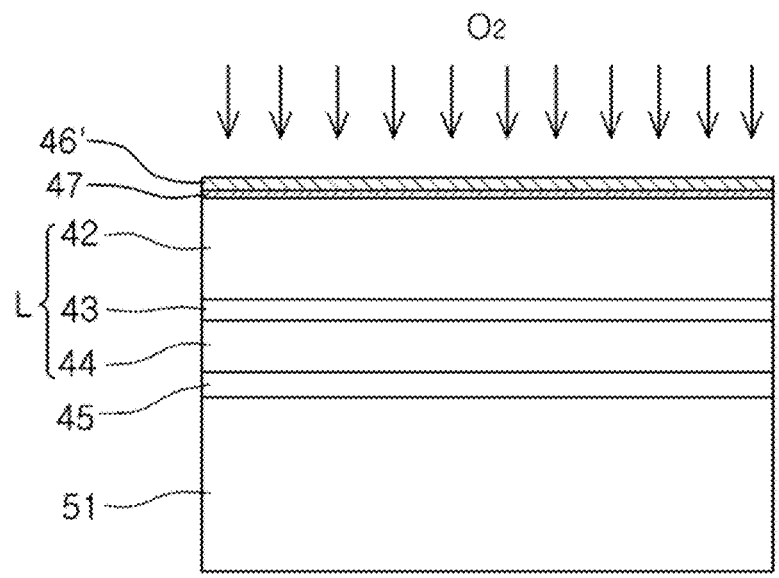

Subsequently, as illustrated in FIG. 4E, the n-type nitride semiconductor layer 42 may be treated with oxygen-containing gas plasma to form an oxygen-added nitride film 47.

During the oxygen-containing gas plasma treatment process, oxygen may be effectively injected to the n-type nitride semiconductor layer 42 by passing through the nitrogen vacancy surface layer 46. Namely, oxygen may be injected into the n-type nitride semiconductor layer 42 through the plurality of nitrogen vacancies to form the oxygen-added nitride film 47. The oxygen-added nitride film 47 may be used as a tunneling layer guaranteeing ohmic-contact in the event of forming an n-side electrode. During this process, a residual nitrogen vacancy surface layer 46' may also react with a small amount of oxygen. As a result, at least a portion of the residual nitrogen vacancy surface layer 46' may be changed into an oxide.

In a case in which the n-type nitride semiconductor layer 42 is an n-type GaN, the oxygen-added nitride film 47 may be a gallium oxy-nitride, and the gallium oxy-nitride may be represented by $GaO_xN_{1-x}$ (0<x<0.5). Also, the residual nitrogen vacancy surface layer 46' may be a gallium oxide, and the gallium oxide may be represented by $Ga_yO_{1-y}$ (0<y<0.5).

Figure 4F:
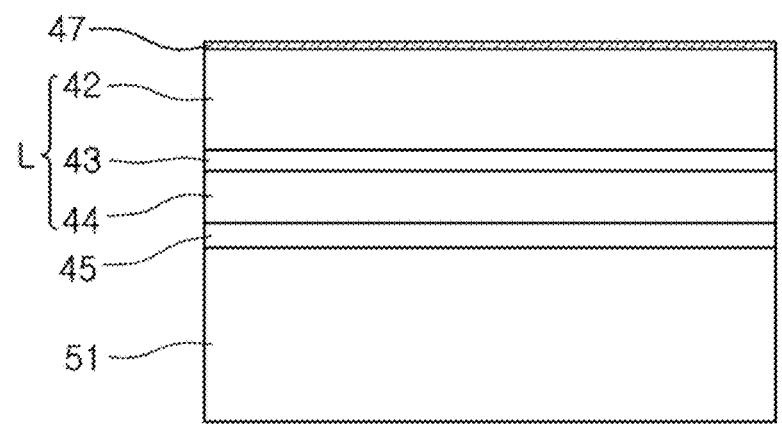

Thereafter, as illustrated in FIG. 4F, the residual nitrogen vacancy surface layer 46' may be removed from the oxygen-added nitride film 47.

The selective removal process may be implemented by an acid treatment process. For example, the residual nitrogen vacancy surface layer 46', which may be an oxide, may be effectively removed by using HCl, and the oxygen-added nitride film 47 may be exposed as the outermost surface. As described above, after the oxygen-containing gas plasma treatment, an electrode process may be performed without the selective removal process according to whether the residual nitrogen vacancy surface layer 46' is formed and a state thereof.

Figure 4G:
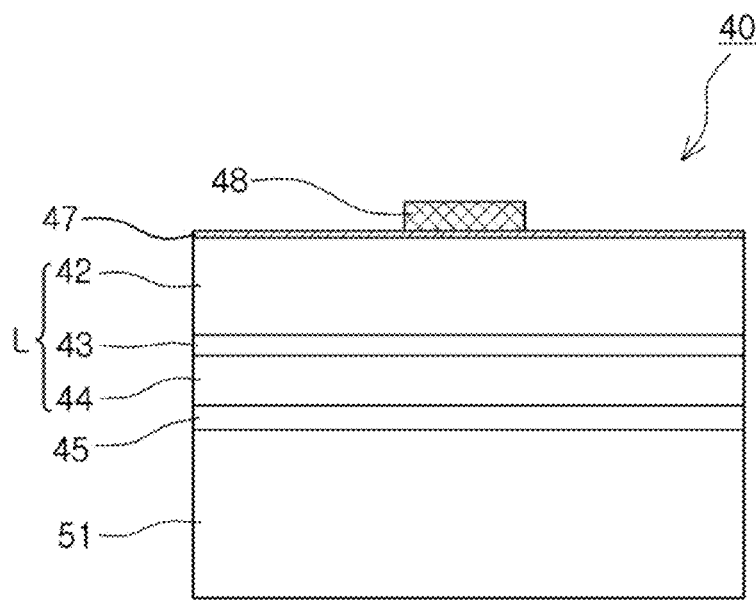

Subsequently, as illustrated in FIG. 4G, an electrode 48 may be formed on the oxygen-added nitride film 47. Thus, a vertical nitride semiconductor light emitting element 40 may be formed. The electrode 48 may be in ohmic-contact with the n-type nitride semiconductor 42 due to a tunneling behavior of the oxygen-added nitride film 47. The electrode 48 may be formed of at least one metal. The electrode 48 may be formed of at least one of aluminum (Al) and silver (Ag), nickel (Ni), rhodium (Rh), palladium (Pd), iridium (Ir), ruthenium (Ru), magnesium (Mg), zinc (Zn), platinum (Pt), gold (Au), chromium (Cr), and titanium (Ti). The electrode 48 is may be formed of a metal other than aluminum (Al) and silver (Ag). An additional heat treatment process that may damage the surface of the nitride semiconductor may be omitted.

The oxygen-added nitride film 47 obtained during this process may contain an element (e.g., Ar) of the inert gas used during the first plasma treatment process as an impurity. This is because the inert gas element injected into the n-type nitride semiconductor layer 42 during the first plasma treatment process may remain in the interior of the nitride vacancy surface layer 46 and in the interface between the nitride vacancy surface layer 46 and the n-type nitride semiconductor layer 42.

The inert gas element such as Ar does not significantly affect the oxygen-added nitride film 47. In this sense, the inert gas element used as plasma may be contained as an impurity not affecting the film characteristics. In a final product stage, the oxygen-added nitride film 47 obtained may include the inert gas element existing as an impurity.

In an example embodiment, an electrode may be formed to allow for a high current operation.

Figure 5:
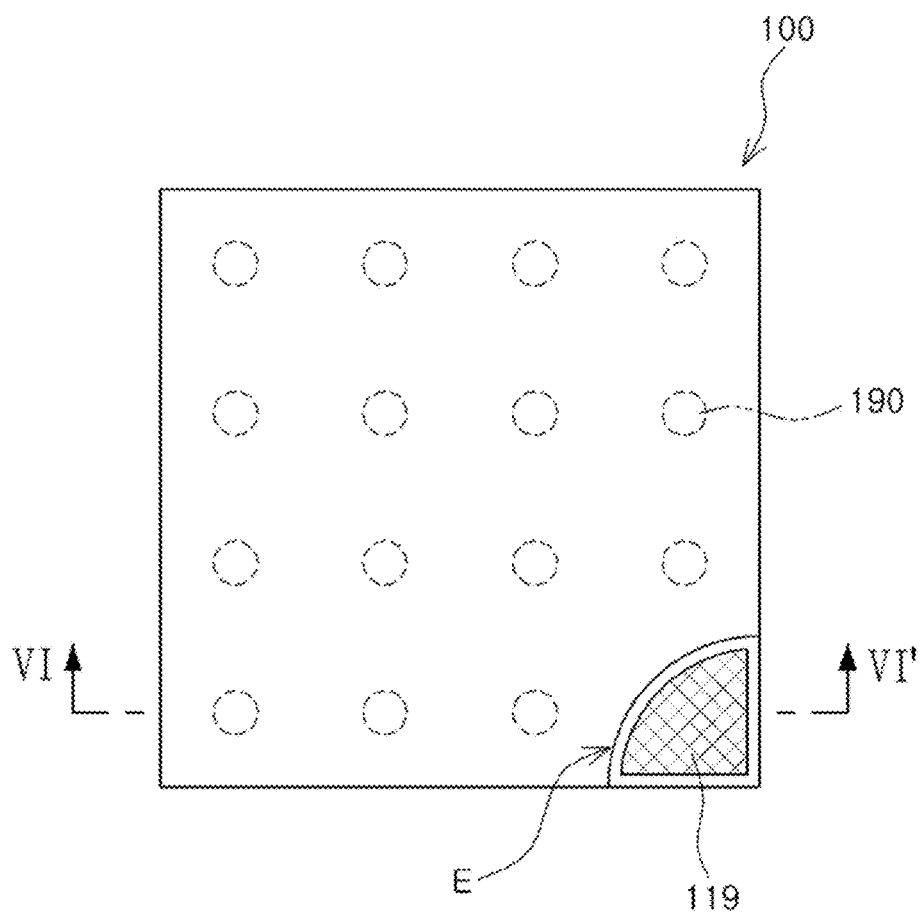
FIGS. 5 and 6 are a plan view and a side-sectional view illustrating a nitride semiconductor light emitting element according to an example embodiment.
Figure 6:
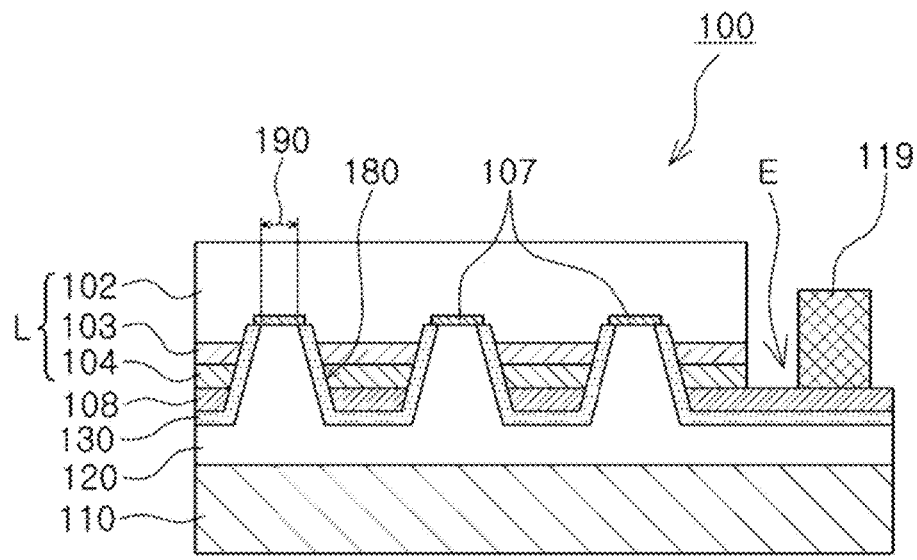

FIGS. 5 and 6 are a plan view and a cross-sectional view illustrating a light emitting element as another example of a nitride semiconductor light emitting element according to an example embodiment. FIG. 6 is a cross-sectional view taken along line VI-VI' in FIG. 5.

Referring to FIGS. 5 and 6, a nitride semiconductor light emitting element 100 includes a conductive substrate 110, a first electrode 108, an insulating layer 130, a second electrode 120, a p-type nitride semiconductor layer 104, an active layer 103, and an n-type nitride semiconductor layer 102. The conductive substrate 110, first electrode 108, insulating layer 130, second electrode 120, p-type nitride semiconductor layer 104, active layer 103, and n-type nitride semiconductor layer 102 may be sequentially stacked on each other.

The conductive substrate 110 may be formed of a material allowing electricity to flow therein. For example, the conductive substrate 110 may include a metal substrate and/or a semiconductor substrate. For, if the conductive substrate 110 is a metal substrate, the metal substrate may include at least one of gold (Au), nickel (Ni), copper (Cu), and tungsten (W). If the conductive substrate 110 includes a semiconductor substrate, the semiconductor substrate may include at least one of silicon (Si), germanium (Ge), and gallium arsenide (GaAs). The first electrode 108 may be stacked on the conductive substrate 110.

The first electrode 108 is positioned to be connected to the p-type nitride semiconductor layer 104. A contact hole 180, penetrating through the first electrode 108, the p-type nitride semiconductor layer 104, and the active layer 103 so as to extend to a desired (and/or alternatively predetermined) region of the n-type nitride semiconductor layer 102 may be formed in the nitride laminate L. A partial region of the second electrode 120 may be connected to the insulating layer 130 and the n-type nitride semiconductor layer 102 through the contact hole 180. Accordingly, the conductive substrate 110 and the n-type nitride semiconductor layer 102 may be electrically connected.

The insulating layer 130 may be provided on the first electrode 108 in order to electrically insulate the second electrode 120 from other regions excluding the conductive substrate 110 and the n-type nitride semiconductor layer 102. As illustrated in FIG. 6, the insulating layer 130 may be formed on lateral surfaces of the contact hole 180, as well as between the first electrode 108 and the second electrode 120. Accordingly, the insulating layer 130 may insulate the second electrode 120 exposed to the lateral surfaces of the contact hole 180 and insulate the second electrode 120 from the p-type nitride semiconductor layer 104 and the active layer 103.

In an example embodiment, the electrode forming process described above with reference to FIGS. 2A through 2E may be applied to a contact region 190 of the n-type nitride semiconductor layer 102 exposed by the contact hole 180. For example, the contact hole 180 may be formed in the nitride laminate L, the insulating layer 130 may be formed to expose a partial region of the n-type nitride semiconductor layer, the inert gas plasma treatment may be applied as a first plasma treatment (please see FIG. 2B), and the oxygen-containing gas plasma treatment may be applied as a second plasma treatment (please see FIG. 2C). Through the second plasma treatment, the n-type nitride semiconductor layer 102 may form ohmic-contact with the second electrode 120 to be formed in a follow-up process. Before forming the second electrode 120, an acid treatment process (please see FIG. 2D) may be additionally applied to remove a nitrogen vacancy surface layer (which may be partially bonded with oxygen) remaining in a surface of the contact region 190 after the second plasma treatment.

Meanwhile, as illustrated in FIG. 6, the first electrode 108 may have an exposed region not in contact with the p-type nitride semiconductor layer 104. One or more exposed regions E may be provided. An electrode pad part 219 may be provided in the exposed region E to connect an external power source to the first electrode 108.

As illustrated in FIG. 6, the exposed region E may be formed in one corner of the nitride semiconductor light emitting element 100 in order to increase and/or maximize a light emitting area. The first electrode 108 may be formed of a material having high reflectivity, while being in ohmic-contact with the p-type nitride semiconductor layer 104. A material of the first electrode 108 may include a metal such as at least one of among silver (Ag), aluminum (Al), and platinum (Pt), but example embodiments are not limited thereto.

Figure 7:
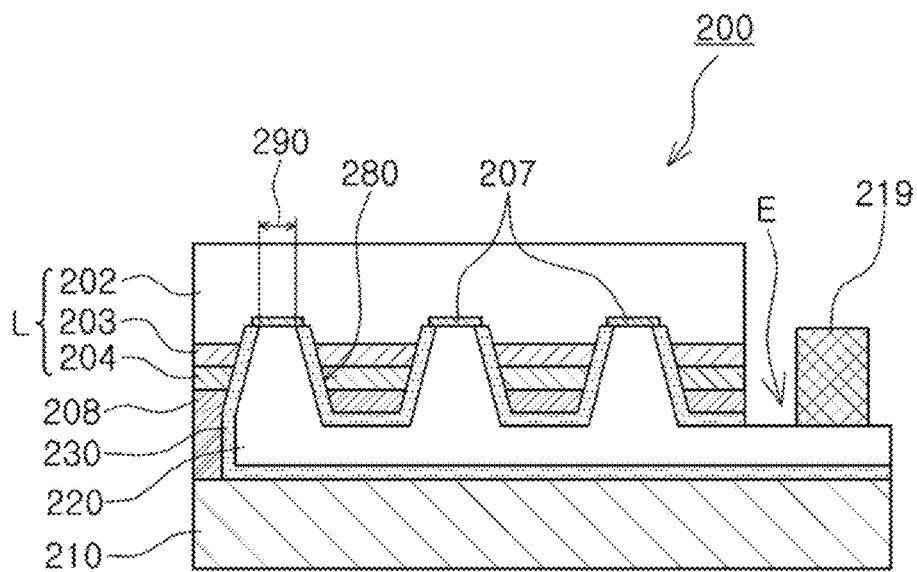
FIG. 7 is a side-sectional view illustrating another example of a nitride semiconductor light emitting element according to an example embodiment.

FIG. 7 is a side-sectional view illustrating another example of a nitride semiconductor light emitting element according to an example embodiment.

Referring to FIG. 7, a nitride semiconductor light emitting element 200 may include a conductive substrate 210 and a nitride laminate L positioned on the conductive substrate 210. The nitride laminate L may include a p-type nitride semiconductor layer 204, an active layer 203, and an n-type nitride semiconductor layer 202. A first electrode 208 may be disposed between the p-type nitride semiconductor layer 204 and the conductive substrate 210. Unlike the nitride semiconductor light emitting element 100 described with reference to FIGS. 5-6, the first electrode 208 may be directly connected to the conductive substrate 210.

The nitride laminate L may have a contact hole 280 formed therein to expose a contact region 290 of the n-type nitride semiconductor layer 202. The contact region 290 may be connected to the second electrode 220. However, unlike the nitride semiconductor light emitting element 100 described with reference to FIGS. 5-6, the second electrode layer 220 may have a region E outwardly extended to be exposed, and an electrode pad part 219 may be formed in the region E. The second electrode 220 may be electrically separated from the active layer 203, the p-type nitride semiconductor layer 204, the first electrode 208, and the conductive substrate 210 by an insulating layer 230.

In an example embodiment, the electrode forming process described above with reference to FIGS. 2A through 2E may be applied to the contact region 290 of the n-type nitride semiconductor layer 202 exposed by the contact hole 280. Through the electrode forming process based on the second plasma treatment, the n-type nitride semiconductor layer 202 may form ohmic-contact with the second electrode 220 to be formed in a follow-up process.

Hereinafter, non-limiting examples of semiconductor light emitting elements and comparative examples are described

Example 1A

A nitride laminate for a vertical nitride semiconductor light emitting element having a structure similar to the vertical nitride semiconductor light emitting element 40 illustrated in FIG. 4G was manufactured. First plasma (Ar) treatment and second plasma ($O_2$) treatment were applied to a contact region (N surface) of an n-type GaN after a sapphire substrate as a growth substrate was removed.

In detail, during the first plasma treatment process, an RF voltage was applied under conditions in which chamber pressure was 60 atm and an Ar flow rate was 800 sccm to generate an Ar plasma to process the n-type GaN contact region. Subsequently, during the second plasma treatment process, an RF voltage was applied under conditions in which chamber pressure was 200 atm and $O_2$ flow rate was 800 sccm to generate an oxygen plasma to process the n-type GaN contact region.

Figure 8:
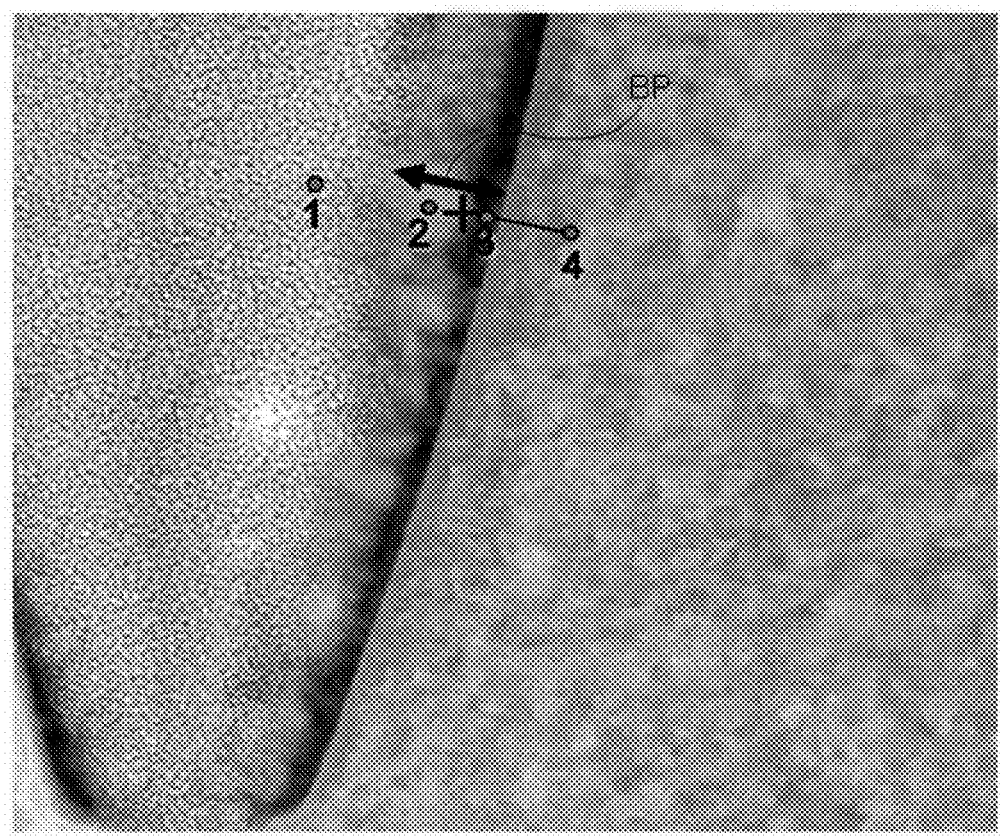
FIG. 8 is a transmission electron microscope (TEM) photograph of a section near a plasma-treated GaN surface according to Example 1A.

After the argon and oxygen plasma treatments, the vicinity of the n-type GaN surface was analyzed by a transmission electron microscope (TEM). FIG. 8 is a photograph obtained by taking a cross-section near a platinum (Pt)-sputtered surface, and FIGS. 9A) through 9D) are graphs illustrating results of analyzing components at points indicated by numbers 1, 2, 3, and 4 on the n-type GaN surface shown in FIG. 8.

Figure 9A:
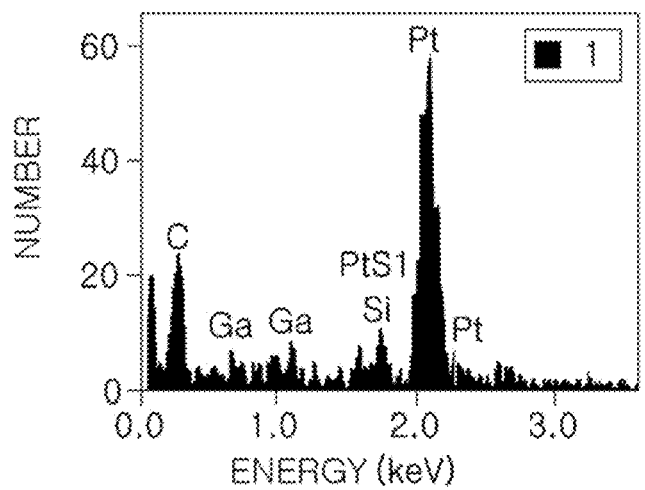
FIGS. 9A through 9D are graphs illustrating component data analysis results based on positions near the plasma-treated GaN surface according to Example 1A.

Referring to FIG. 9A, silicon (Si) and carbon (C), n-type impurities, were detected together with gallium (Ga) in addition to the sputtered metal component (Pt) used for the TEM measurement, and an N component was rarely detected. FIG. 9D illustrates component analysis results at points not affected by a plasma treatment, which are understood as component analysis results substantially identical to those of the n-type GaN before a plasma treatment was performed.

Figure 9B:
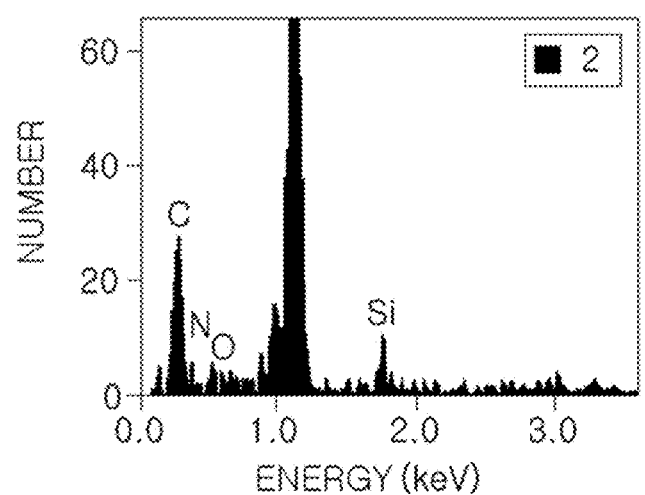
Figure 9C:
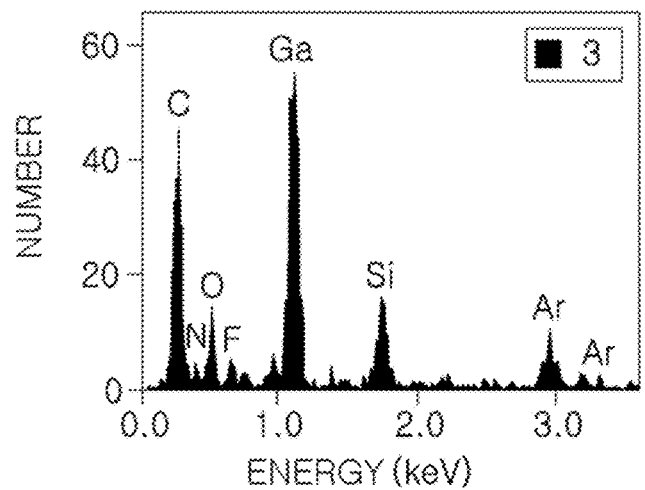
Figure 9D:
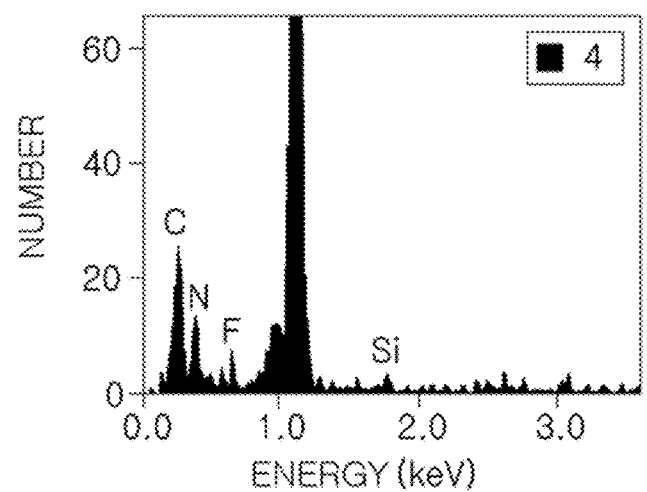

FIGS. 9B and 9C are graphs illustrating results of analyzing components of a reactant generated by a plasma treatment.

Referring to FIGS. 9B and 9C (points 2 and 3), gallium (Ga) appeared as a main ingredient, and trace amounts of O and N components were also detected. In particular, a small amount of N component, relative to other points, was detected. The reason for the detection of the small amount of N component may be understood that since Ga—N bond was broken from the GaN surface during the Ar plasma treatment process, a plurality of nitrogen vacancies were generated near a surface thereof.

In particular, it can be seen that a large amount of O component was detected from point 3, relative to that detected from point 2. Also, a relatively large amount of Ar was detected from point 3. It can be seen that as the Ar element was injected up to point 3 during the Ar plasma treatment process, Ga—N bond was broken to form N vacancies, and a large amount of oxygen (O) was injected up to point 3 through the vacancies.

Figure 10A:
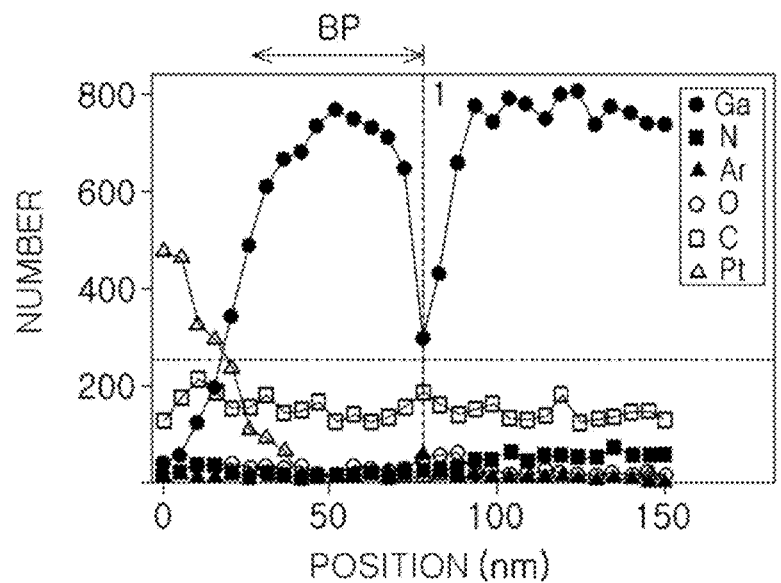
FIGS. 10A and 10B are graphs illustrating element distributions in the plasma-treated GaN surface in a thickness direction according to Example 1A.
Figure 10B:
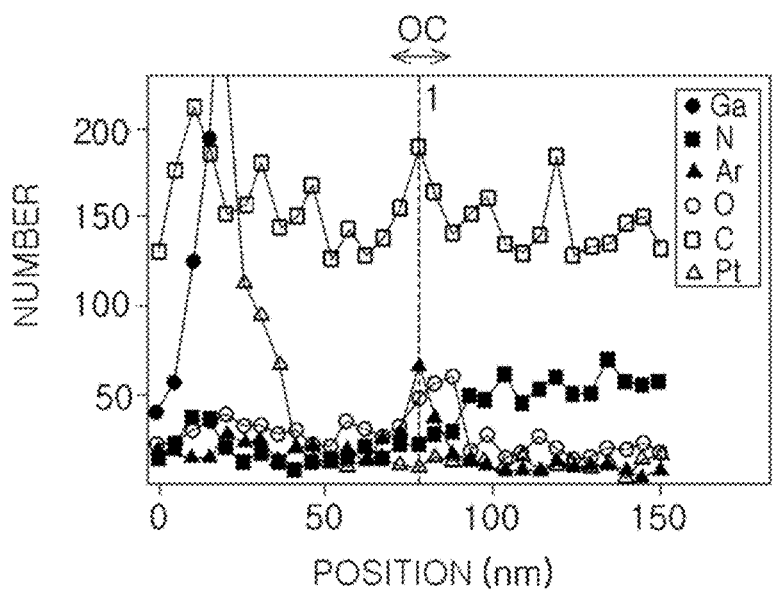

FIGS. 10A and 10B are graphs illustrating the foregoing component analysis results based on positions in a thickness direction. FIG. 10B is a graph illustrating a region under count 200 in FIG. 10A in a magnified manner.

Referring to FIG. 10A, a region having a thickness of approximately 50 nm from a surface (x axis: approximately 25 nm) of the GaN semiconductor layer was indicated by "BP" as a region corresponding to point 2. In the region BP, an extremely small amount of N components were detected, and a small amount of O components were partially present. The region BP may be understood as a residual nitrogen vacancy surface layer (which is partially bonded with oxygen) after the Ar plasma treatment has been performed.

Next to the region BP, a region having a thickness of approximately 10 nm to 20 nm is indicated by "OC" as a region corresponding to point 3. In the region OC, the N component was slightly increased and a relatively large amount of O components was present. The region OC may be understood as an oxygen-added nitride film provided as a tunneling layer between an electrode and an n-type GaN layer. In particular, in the region OC, a considerable amount of argon (Ar) was detected. This may be understood as a result obtained as Ar injected during the Ar plasma treatment remained. In this manner, even in a final product, the oxygen-added nitride film may contain Ar as an impurity.

Example 2A

A nitride laminate was manufactured for a horizontal nitride semiconductor light emitting element having a structure similar to that illustrated in FIG. 3G. A first plasma (Ar) treatment and a second plasma (O₂) treatment were applied to a contact region (Ga face) of an n-type GaN exposed through mesa etching under the conditions similar to those of Example 1A.

In detail, during the first plasma treatment process, an RF voltage was applied under conditions in which chamber pressure was 60 atm and an Ar flow rate was 800 sccm to generate an Ar plasma to process the n-type GaN contact region. Subsequently, during the second plasma treatment process, an RF voltage was applied under conditions in which chamber pressure was 200 atm and O₂ flow rate was 800 sccm to generate an Ar plasma to process the n-type GaN contact region.

Figure 11:
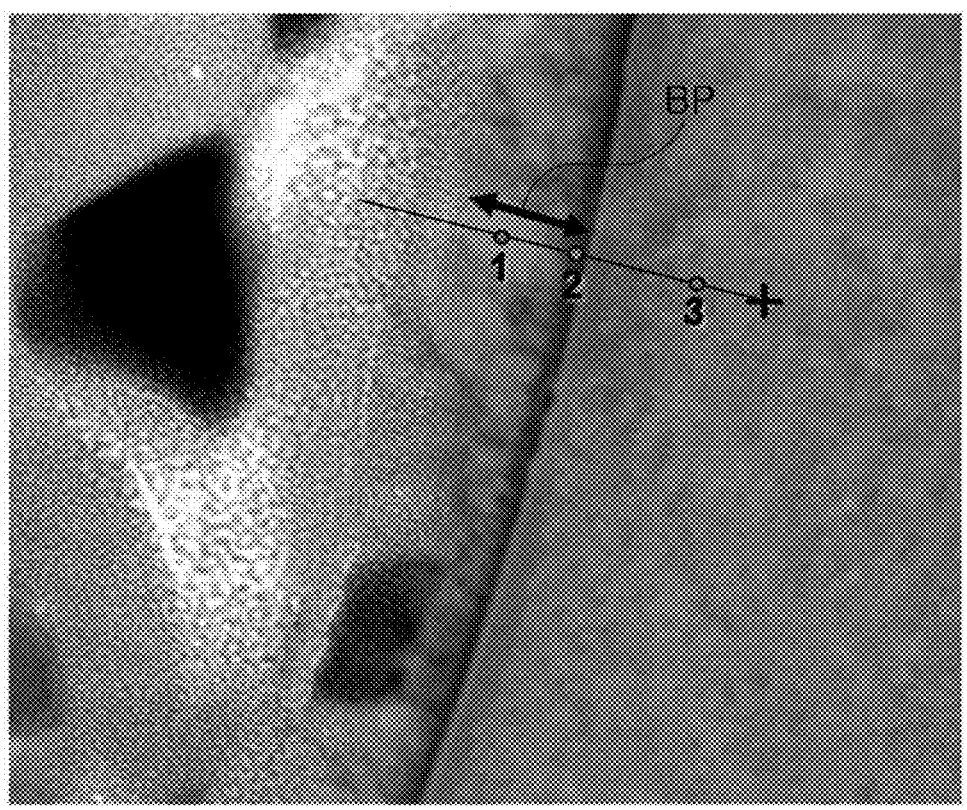
FIG. 11 is a TEM photograph of a section near a plasma-treated GaN surface according to Example 2A.
Figure 12A:
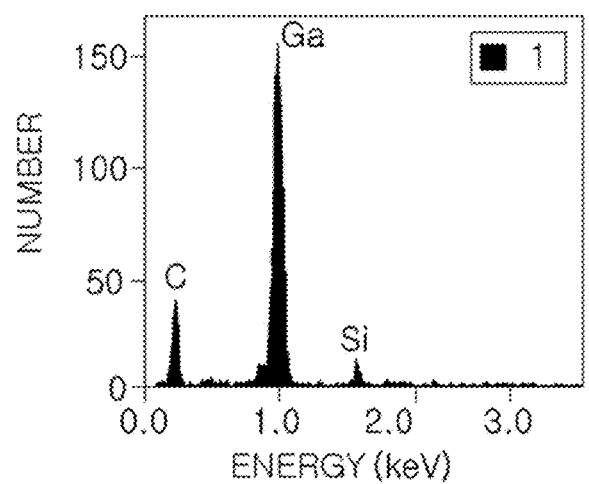
FIGS. 12A through 12C are graphs illustrating component data analysis results based on positions near the plasma-treated GaN surface according to Example 2A.
Figure 12B:
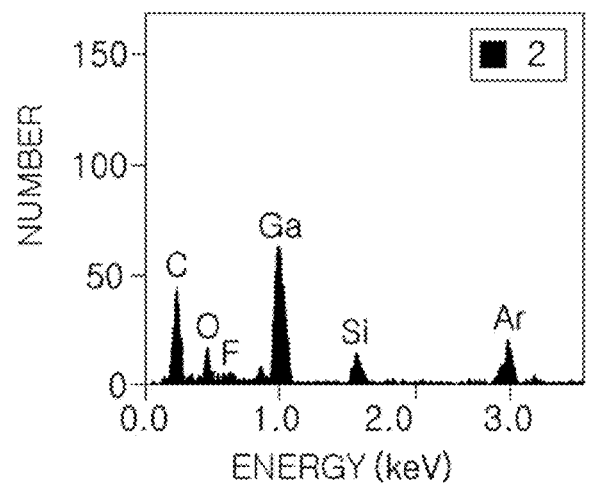
Figure 12C:
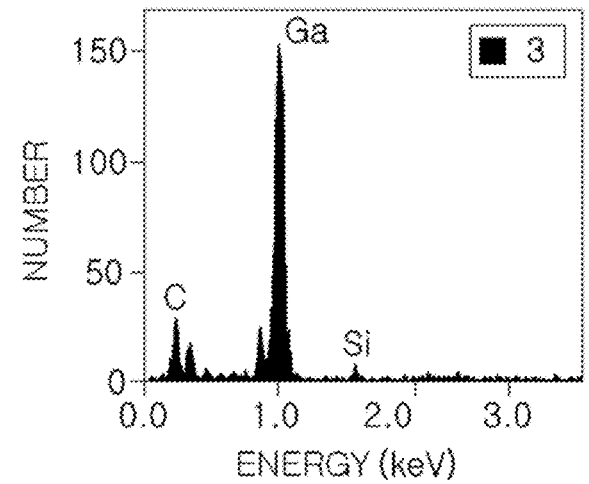

After the Ar and oxygen plasma treatments, the vicinity of the n-type GaN surface was analyzed by a transmission electron microscope (TEM). FIG. 11 is a photograph obtained by taking a cross-section near a platinum (Pt)-sputtered surface, and FIGS. 12A through 12C are graphs illustrating results of analyzing components at points indicated by numbers 1, 2, and on the n-type GaN surface shown in FIG. 11. FIG. 12C illustrates component analysis results at points not affected by a plasma treatment, showing the same analysis results as the original n-type GaN. Meanwhile, referring to FIG. 12A, N components were rarely detected, and only silicon (Si) and carbon (C), together with gallium (Ga) as a main ingredient, were detected. Namely, it may be understood that Ga—N bond was broken near the surface corresponding to point 1 during the Ar plasma treatment process, generating a plurality of nitrogen vacancies.

Meanwhile, referring to FIG. 12B, O and Ar components were detected. Namely, this may be understood that the Ar element was injected up to the point during the Ar plasma treatment process and a large amount of oxygen (O) was injected through the vacancies to form an oxygen-containing nitride film.

Figure 13A:
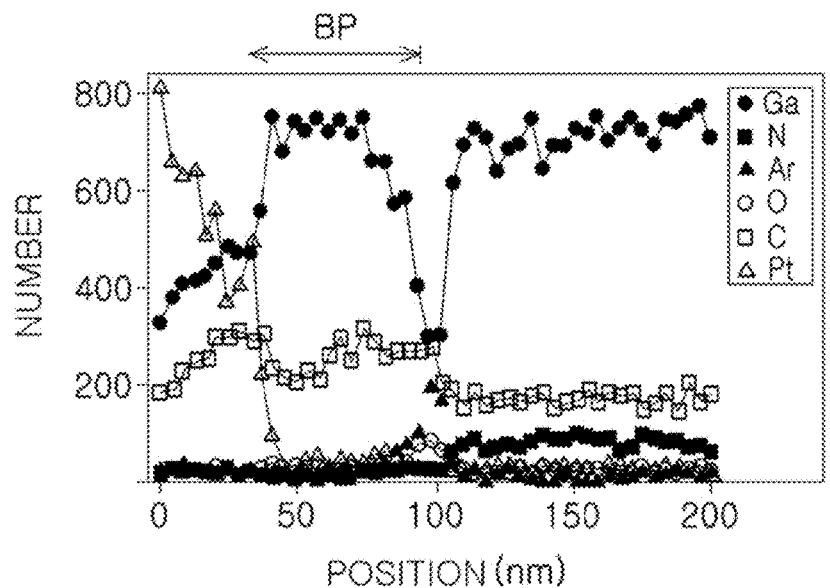
FIGS. 13A and 13B are graphs illustrating element distributions in the plasma-treated GaN surface in a thickness direction according to Example 2A.
Figure 13B:
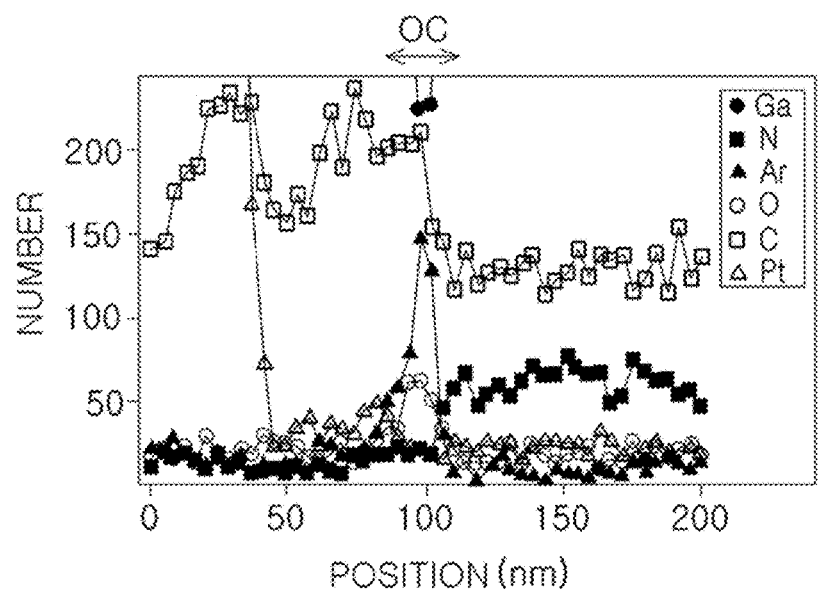

FIGS. 13A and 13B are graphs illustrating the foregoing component analysis results based on positions in a thickness direction. FIG. 13B is a graph illustrating a region under count 200 in FIG. 13A in a magnified manner.

Referring to FIG. 13A, a region having a thickness of approximately 50 nm from a surface (x axis: approximately 25 nm) of the GaN semiconductor layer was indicated by "BP" as a region corresponding to point 1. In the region BP, an extremely small amount of N components were detected, and a small amount of O components were partially present. The region BP may be understood as a residual nitrogen vacancy surface layer (which is partially bonded with oxygen) after the Ar plasma treatment has been performed.

Next to the region BP, a region having a thickness of approximately 10 nm to 20 nm is indicated by "OC" as a region corresponding to point 2. In the region OC, the N component was slightly increased and a relatively large amount of O components was present. The region OC may be understood as an oxygen-added nitride film provided as a tunneling layer between an electrode and an n-type GaN layer. In particular, in the region OC, a considerable amount of argon (Ar) was detected. This may be understood as a result obtained as Ar injected during the Ar plasma treatment remained. In this manner, even in a final product, the oxygen-added nitride film may contain Ar as an impurity.

Example 1B

An acid treatment was performed on a contact region treated with plasma according to Example 1A by using an HCl solution, and an Al/Ti was formed as an n-side electrode, thus manufacturing a vertical nitride semiconductor light emitting element (samples were classified into two groups manufactured at different times).

Figure 14:
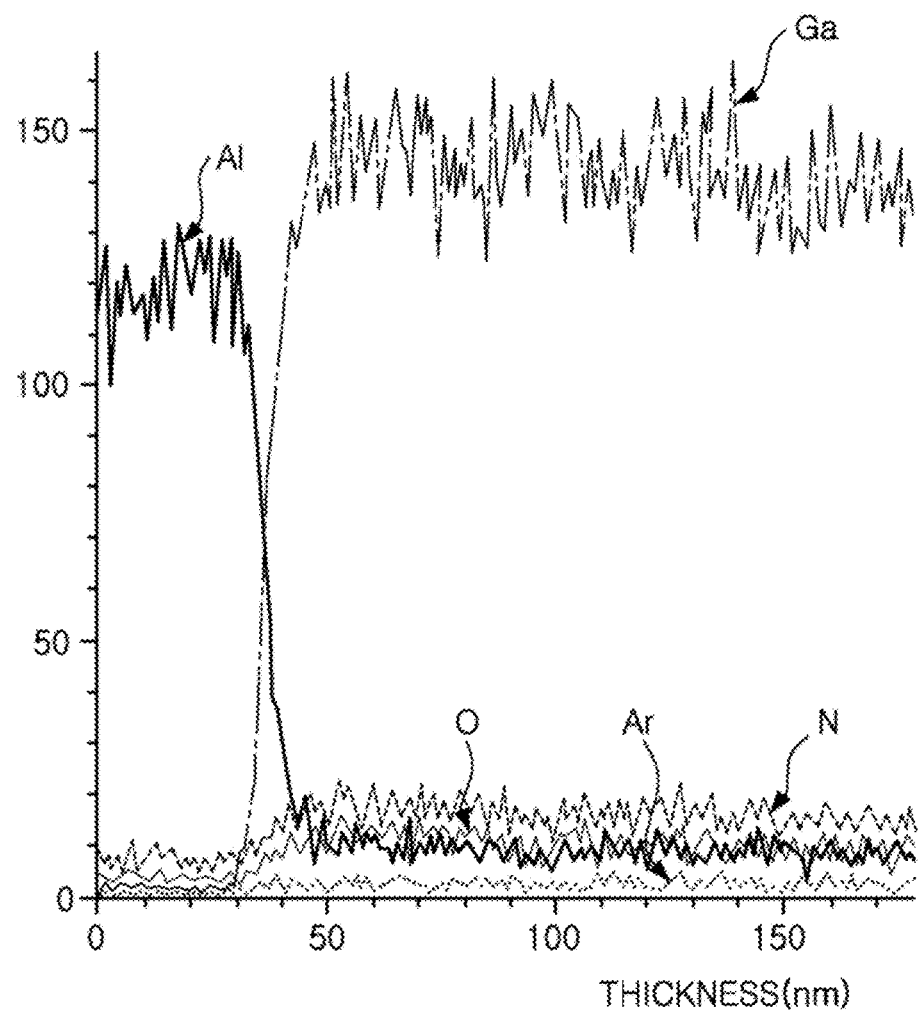
FIG. 14 is a graph illustrating TEM energy dispersive x-ray (EDX) results obtained through analysis after formation of an n-electrode on a plasma-treated GaN surface according to Example 1B.

FIG. 14 is a graph illustrating TEM EDX analysis results based on positions in the contact region in which the electrode Example 1B was formed. It can be seen that an Al layer was formed on a surface of a region (oxygen-added nitride film $GaO_xN_{1-x}$) in which oxygen and nitrogen elements were detected together.

Comparative Example 1A

A nitride semiconductor light emitting element was manufactured under the conditions identical to those of Example 1B by using a nitride laminate identical to that of Example 1A, except that an n-side electrode was formed on a surface of the n-type GaN by using Al/Ti without applying any plasma treatment.

Comparative Example 1B

A nitride semiconductor light emitting element was manufactured under the conditions identical to those of Example 1B by using a nitride laminate identical to that of Example 1A, except that an n-side electrode was formed on a surface of the n-type GaN by using Al/Ti by applying only oxygen (O₂) plasma treatment, without an Ar plasma treatment The oxygen plasma generation and treatment conditions were identical to those of Example 1A.

Figure 15:
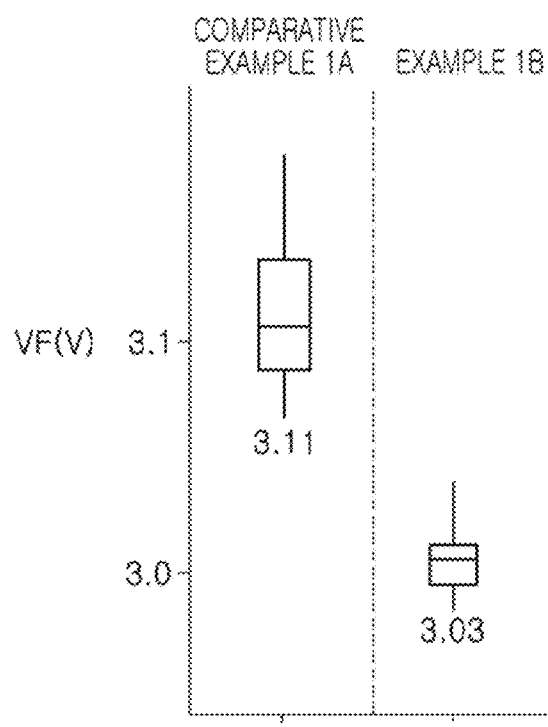
FIG. 15 is a graph illustrating a comparison between driving voltages of nitride semiconductor light emitting elements manufactured according to Example 1B and Comparative Example 1A.

Forward voltages of samples of a first group of Example 1B and samples of Comparative Example 1A were measured, and results thereof are illustrated as the graph of FIG. 15

As illustrated in FIG. 15, average forward voltages of the first group of Example 1B and Comparative Example 1A appeared as 3.11V and 3.03V, respectively, and it can be seen that a driving voltage was improved by 0.08 in the case in which a plasma treatment was performed, in comparison to the case in which a plasma treatment was not performed.

Next, forward voltages of samples of a second group of Example 1B and samples of Comparative Example 1B were measured. As a result, average forward voltages of the second group (Measurement parameters: 8307) of Example 1B and Comparative Example 1B (Measurement parameters: 7423) were 2.97V and 3.01V, respectively, and it can be seen that a driving voltage was improved by 0.04V in the case in which a plasma treatment was performed, in comparison to a case in which an oxygen plasma treatment was performed without an inert gas plasma treatment.

Example 2B

After an acid treatment was performed on a contact region treated with plasma according to Example 1B by using an HCl solution, an n-side electrode was formed with Al/Ti, thus manufacturing a vertical nitride semiconductor light emitting element.

Comparative Example 2A

A horizontal nitride semiconductor light emitting element was manufactured by using the nitride laminate used in Example 1B, except that an n-side electrode was formed with aluminum (Al) having excellent reflectivity without performing a plasma treatment in a contact region.

Comparative Example 2B

A horizontal nitride semiconductor light emitting element was manufactured by using the nitride laminate used in Example 1B, except that an n-side electrode was formed with chromium (Cr) capable of forming ohmic-contact with n-type GaN without performing a plasma treatment on a contact region.

Forward voltage characteristics of samples obtained according to Example 1B and those of samples of Comparative Example 2A were compared, and optical power of samples obtained according to Example 1B and that of samples of Comparative Example 2B were compared. The results thereof are illustrated in FIGS. 16 and 17.

Figure 16:
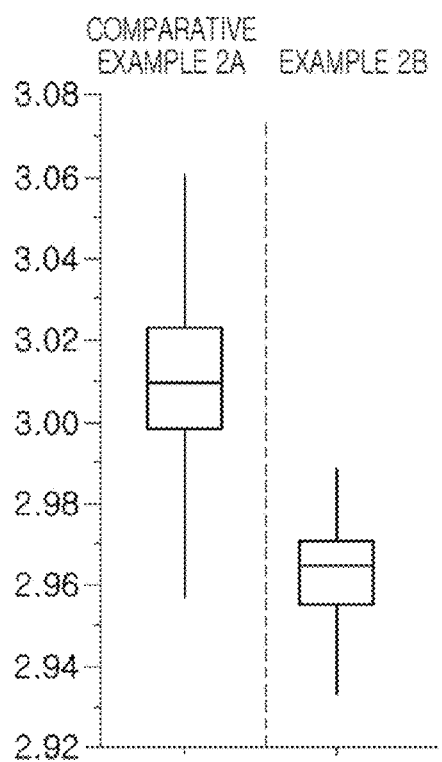
FIG. 16 is a graph illustrating a comparison between driving voltages of nitride semiconductor light emitting elements manufactured according to Example 2B and Comparative Example 2A.
Figure 17:
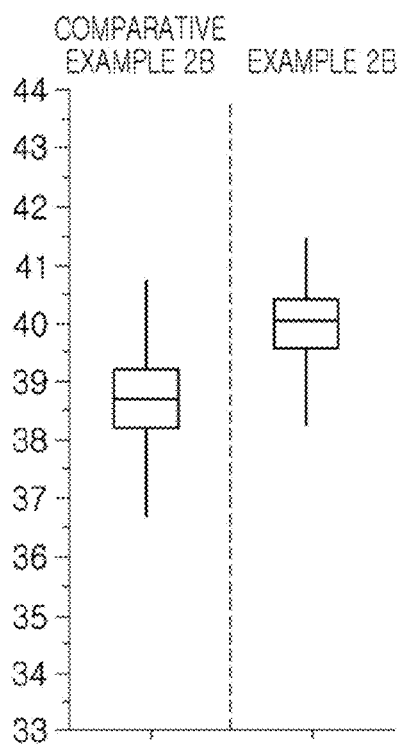
FIG. 17 is a graph illustrating a comparison between outputs of nitride semiconductor light emitting elements manufactured according to Example 2B and Comparative Example 2B.

As illustrated in FIG. 16, in the case of the Example 2B, a forward voltage was lowered by 0.4V in comparison to the case (Comparative Example 2A) in which a plasma treatment was not performed. Namely, since the n-side electrode may be formed of aluminum (Al) having excellent ohmic characteristics even without a follow-up heat treatment, optical power can be significantly improved, relative to the case in which n-side electrode is formed of chromium (Cr) having low reflectivity (please see FIG. 17).

Example 3

A nitride laminate for a vertical-horizontal nitride semiconductor light emitting element having a structure similar to that illustrated in FIGS. 5 and 6 was manufactured. A first plasma (Ar) treatment and a second plasma ($O_2$) treatment were applied to a contact region (Ga face) of an n-type GaN under conditions similar to those of Example 1A.

In detail, during the first plasma treatment process, an RF voltage was applied under conditions in which chamber pressure was 60 atm and an Ar flow rate was 800 sccm to generate an Ar plasma to process the n-type GaN contact region. Subsequently, during the second plasma treatment process, an RF voltage was applied under conditions in which chamber pressure was 200 atm and $O_2$ flow rate was 800 sccm to generate an Ar plasma to process the n-type GaN contact region.

An acid treatment was performed on the plasma-treated contact region by using an HCl solution, and an n-side electrode was formed of Al/Ti, thus manufacturing a vertical nitride semiconductor light emitting element.

Comparative Example 3

A vertical-horizontal nitride semiconductor light emitting element was manufactured by using the nitride laminate used in Example 3, except that an n-side electrode was formed with Al/Ti capable of forming ohmic-contact with an n-type GaN without performing a plasma treatment on a contact region.

Figure 18:
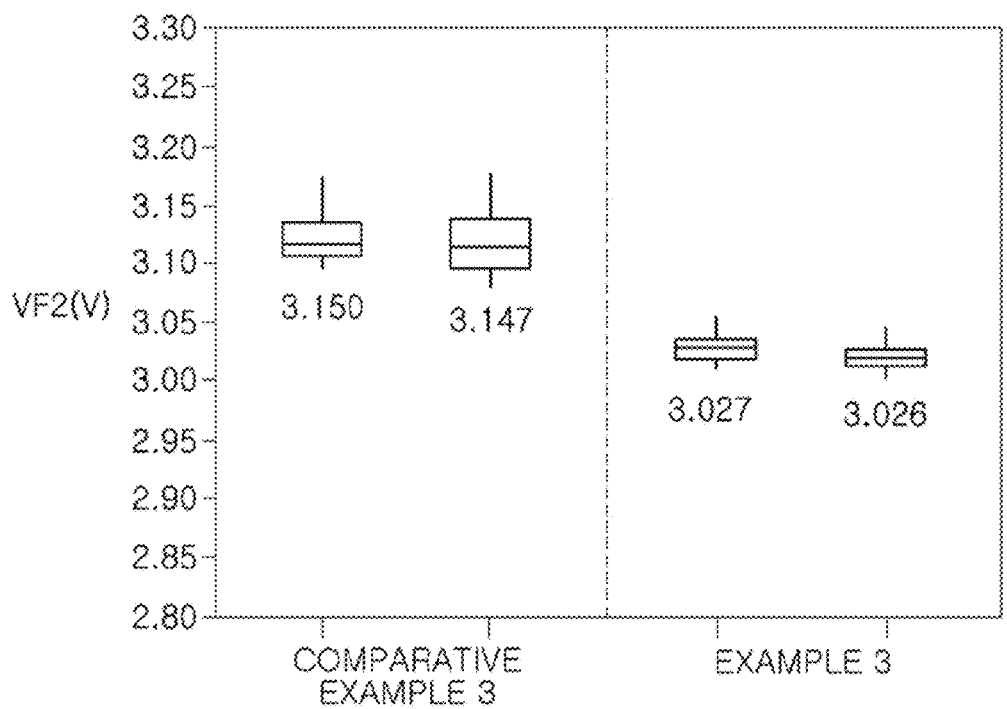
FIG. 18 is a graph illustrating a comparison between driving voltages of nitride semiconductor light emitting elements manufactured according to Example 3 and Comparative Example 3.

FIG. 18 shows a comparison between forward voltage characteristics of the samples obtained according to Example 3 and samples of Comparative Example 3. The left data are values measured before performing annealing, and right data are values measured after performing annealing at a temperature ranging from 260° C. to 300° C.

As illustrated in FIG. 18, it can be seen that, in the case of example 3, a forward voltage was lowered by 1.23V before performing annealing and by 1.21V after performing annealing, in comparison to the case (Comparative Example 3) in which a plasma treatment was not performed.

Nitride semiconductor light emitting elements according to some example embodiments may be advantageously applied to various application products.

Figure 19:
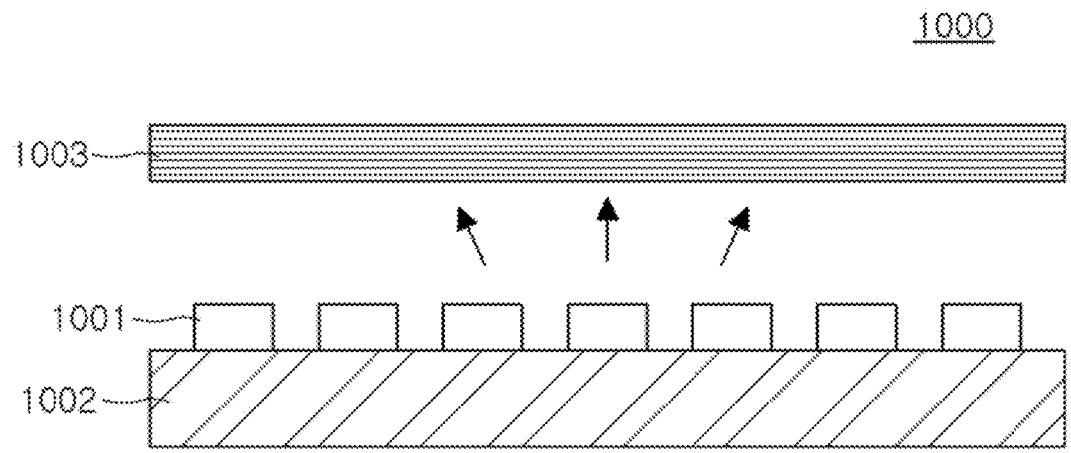
FIGS. 19 and 20 are views illustrating a backlight unit employing a nitride semiconductor light emitting element according to an example embodiment.
Figure 20:
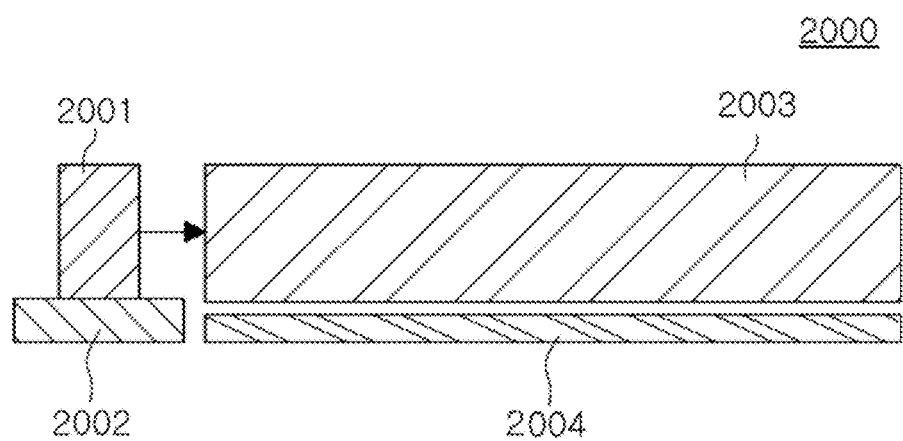

FIGS. 19 and 20 are views illustrating examples of a nitride semiconductor light emitting device and a backlight unit employing a package thereof according to an example embodiment.

Referring to FIG. 19, a backlight unit 1000 includes light sources 1001 mounted on a substrate 1002 and one or more optical sheets 1003 disposed above the light sources 1001. The aforementioned semiconductor light emitting device or a package employing the semiconductor light emitting device may be used as the light sources 1001.

Unlike the backlight unit 1000 in FIG. 19 in which the light sources 1001 emit light toward an upper side on which a liquid crystal display is disposed, a backlight unit 2000 as another example illustrated in FIG. 20 is configured such that light sources 2001 mounted on a substrate 2002 emit light in a lateral direction, and the emitted light may be made to be incident to a light guide plate 2003 so as to be converted into a surface light source. Light, passing through the light guide plate 2003, is emitted upwards, and in order to enhance light extraction efficiency, a reflective layer 2004 may be disposed on a lower surface of the light guide plate 2003.

Figure 21:
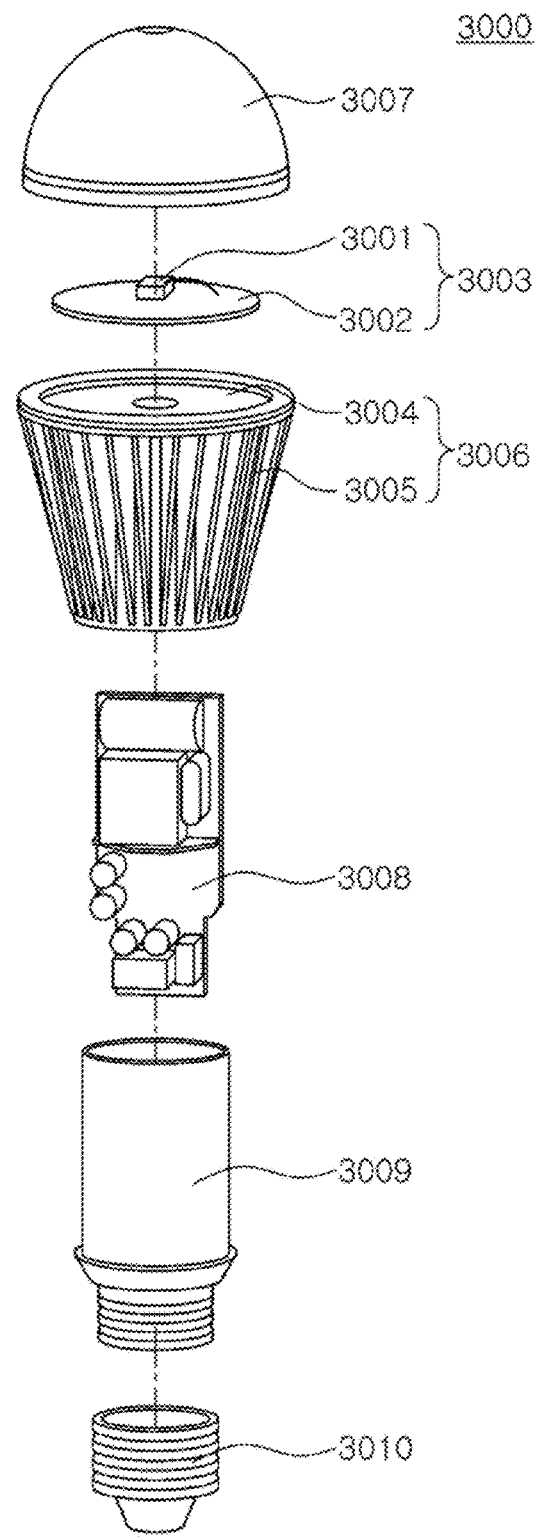
FIG. 21 is a view illustrating an example of a lighting device employing a nitride semiconductor light emitting element according to an example embodiment.

FIG. 21 is a view illustrating an example of a nitride semiconductor light emitting device and a lighting device employing a package thereof according to an example embodiment.

A lighting device 3000 is illustrated, for example, as a bulb-type lamp in FIG. 21, and includes a light emitting module 3003, a driving unit 3008, and an external connection unit 3010. Also, the lighting device 3000 may further include external structures such as external and internal housings 3006 and 3009 and a cover unit 3007. The light emitting module 3003 may include a light source 3001 having the aforementioned nitride semiconductor light emitting device or a package thereof and a circuit board 3002 with the light source 3001 mounted thereon. For example, first and second electrodes of the aforementioned nitride semiconductor light emitting device may be electrically connected to an electrode pattern of the circuit board 3002. In FIG. 21, a single light source 3001 is shown mounted on the circuit board 3020, but a plurality of light sources may be mounted as desired.

The external housing 3006 may serve as a heat dissipation unit and may include a heat dissipation plate 3004 disposed to be in direct contact with the light emitting module 3003 to enhance heat dissipation and heat dissipation fins 3005 surrounding the lateral surfaces of the lighting device 3000. Also, the cover unit 3007 may be installed on the light emitting module 3003 and have a convex lens shape. The driving unit 3008 is installed in the internal housing 3009 and connected to the external connection unit 3010 having a socket structure to receive power from an external power source. Also, the driving unit 3008 may serve to convert power into an appropriate current source for driving the semiconductor light emitting device 3001 of the light emitting module 3003, and provide the same. For example, the driving unit 3008 may be configured as an AC-DC converter, a rectifying circuit component, or the like.

Figure 22:
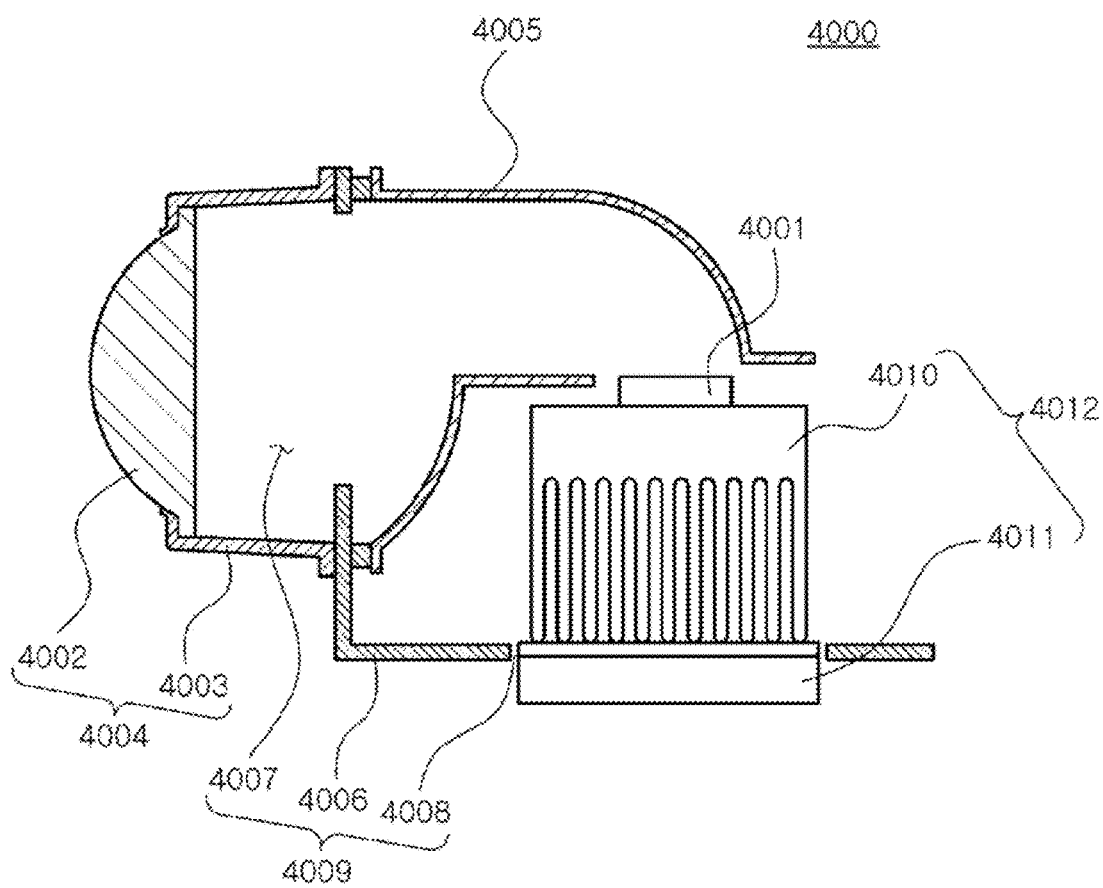
FIG. 22 is a view illustrating an example of a head lamp employing a nitride semiconductor light emitting element according to an example embodiment.

FIG. 22 is a view illustrating an example of an application of a nitride semiconductor light emitting device or a package thereof according to an example embodiment to a head lamp.

Referring to FIG. 22, a head lamp 4000 used as a vehicle lamp, or the like, may include a light source 4001, a reflective unit 4005, and a lens cover unit 4004. The lens cover unit 4004 may include a hollow guide 4003 and a lens 4002. The light source 4001 may include the aforementioned semiconductor light emitting devices or a package including the semiconductor light emitting devices according to some example embodiments.

The head lamp 4000 may further include a heat dissipation unit 4012 outwardly dissipating heat generated by the light source 4001. In order to effectively dissipate heat, the heat dissipation unit 4012 may include a heat sink 4010 and a cooling fan 4011. Also, the head lamp 4000 may further include a housing 4009 fixedly supporting the heat dissipation unit 4012 and the reflective unit 4005, and the housing 4009 may have a central hole 4008 formed in one surface thereof, in which the heat dissipation unit 4012 is coupled.

Also, the housing 4009 may have a front hole 4007 formed in the other surface integrally connected to the one surface and bent in a right angle direction. The front hole 4007 may allow the reflective unit 4005 to be fixedly positioned above the light source 4001. Accordingly, a front side is opened by the reflective unit 4005, and the reflective unit 4005 is fixed to the housing 4009 such that the opened front side corresponds to the front hole 4007, and light reflected by the reflective unit 4005 may pass through the front hole 4007 to be output outwardly. The housing 4009 may include a housing body 4006.

As set forth above, according to some example embodiments, an oxygen-added nitride film may be formed on a surface of an n-type nitride semiconductor layer by applying a surface treatment using inert-gas plasma and oxygen-containing gas plasma, thus considerably improving ohmic characteristics. Thus, surface treatment technique may also be advantageously applied even to the opposite surface (a Ga face in case of GaN), as well as to an N surface of the n-type nitride semiconductor layer.

Thus, the present disclosure may be employed in nitride semiconductor elements having various structures, a driving voltage may be reduced, and efficiency may be improved. In particular, in a semiconductor light emitting element according to an example embodiment, a metal having high reflectivity (for example, aluminum (Al) or silver (Ag)) may be used as an electrode material applied to an n-type nitride semiconductor layer, and light extraction efficiency (namely, optical power) may be improved.

While some example embodiments have been particularly shown and described, it will be understood by one of ordinary skill in the art that variations in form and detail may be made therein without departing from the spirit and scope of the claims.

What is claimed is:

1. A method for forming an electrode on an n-type nitride semiconductor, the method comprising:
    forming a nitrogen vacancy surface layer by treating a surface of the n-type nitride semiconductor with inert gas plasma, the nitrogen vacancy surface layer lacking a nitrogen element;
    forming an oxygen-added nitride film by treating a surface of the nitrogen vacancy surface layer with oxygen-containing gas plasma; and
    forming the electrode on the oxygen-added nitride film.

2. The method of claim 1, wherein
    the forming the nitrogen vacancy surface layer includes using an inert gas to form the inert gas plasma, and
    the oxygen-added nitride film contains the inert gas as an impurity.

3. The method of claim 1, wherein the n-type nitride semiconductor is an n-type gallium nitride (GaN).

4. The method of claim 3, wherein the oxygen-added nitride film is a gallium oxy-nitride.

5. The method of claim 4, wherein
    the forming the nitrogen vacancy surface layer includes using an inert gas to form the inert gas plasma,
    the inert gas is argon (Ar), and
    the oxygen-added nitride film is a gallium oxy-nitride including argon (Ar) added as an impurity.

6. The method of claim 1, wherein the forming the oxygen-added nitride film includes transforming the nitrogen vacancy surface layer into a residual nitrogen vacancy surface layer on the oxygen-added nitride film, and
    the method further includes,
        removing the residual nitrogen vacancy surface layer from the oxygen-added nitride film before the forming the electrode.

7. The method of claim 6, wherein
    the n-type nitride semiconductor is an n-type gallium nitride (GaN), and
    the residual nitrogen vacancy surface layer includes gallium oxide.

8. The method of claim 1, wherein the inert gas includes at least one of helium (He), neon (Ne), argon (Ar), krypton (Kr), and xenon (Xe).

9. The method of claim 1, wherein the forming the oxygen-added nitride film includes using oxygen ($O_2$) to form the oxygen-containing gas plasma.

10. The method of claim 1, wherein the electrode includes at least one of silver (Ag) and aluminum (Al).

11. A method for manufacturing a nitride semiconductor element, the method comprising:
    preparing a nitride laminate, the nitride laminate including an n-type nitride semiconductor layer;
    forming a nitrogen vacancy surface layer by treating a surface of the n-type nitride semiconductor layer with inert gas plasma, the nitrogen vacancy surface layer lacking a nitrogen element;
    forming an oxygen-added nitride film by treating a surface of the nitrogen vacancy surface layer with oxygen-containing gas plasma; and
    forming an electrode on the oxygen-added nitride film.

12. The method of claim 11, wherein the oxygen-added nitride film contains an inert gas as an impurity.

13. The method of claim 11, wherein
    the n-type nitride semiconductor layer includes an n-type gallium nitride (GaN) layer, and
    forming the electrode includes forming the electrode on a surface of the n-type gallium nitride (GaN) layer.

14. The method of claim 11, wherein the oxygen-added nitride film includes gallium oxy-nitride.

15. The method of claim 11, wherein the treating the nitrogen vacancy surface layer with the oxygen-containing gas plasma includes transforming the nitrogen vacancy surface layer into a residual nitrogen vacancy surface layer on the oxygen-added nitride film, and
    the method further includes,
        removing the residual nitrogen vacancy surface layer before forming the electrode by acid-treating the surface of the n-type nitride semiconductor before the forming the electrode.

16. A method of forming an electrode comprising:
    forming a nitrogen vacancy surface layer by generating nitrogen vacancies in a first portion of a n-type nitride semiconductor layer, the first portion of the n-type nitride semiconductor layer being on a second portion of the n-type nitride semiconductor layer;
    forming an oxygen-added nitride film in a third portion of the n-type nitride semiconductor layer by injecting oxygen atoms through the nitrogen vacancy surface layer into the third portion of the n-type nitride semiconductor layer, the third portion being between the first and second portions of the n-type nitride semiconductor layer; and
    forming an electrode on the oxygen-added nitride film.

17. The method of claim 16, wherein the forming the nitrogen vacancy surface layer includes generating the nitrogen vacancies using an inert gas plasma.

18. The method of claim 16, wherein the forming the oxygen-added nitride film includes injecting the oxygen atoms through the nitrogen vacancy surface layer using an oxygen-containing gas plasma.

19. The method of claim 16, wherein
the n-type nitride semiconductor includes a Group-III nitride semiconductor represented by the formula $Al_xIn_yGa_{1-x-y}N$,
where $0 \leq x < 1$, $0 \leq y < 1$, and $0 \leq x+y < 1$.

20. The method of claim 16, wherein the oxygen-added nitride film includes gallium oxy-nitride.

* * * * *